US012685191B2

(12) United States Patent
Tsai et al.

(10) Patent No.: US 12,685,191 B2
(45) Date of Patent: Jul. 14, 2026

(54) INTERPOSER VIA INTERCONNECT SHAPES WITH IMPROVED PERFORMANCE CHARACTERISTICS AND METHODS OF FORMING THE SAME

(71) Applicant: Taiwan Semiconductor Manufacturing Company Limited, Hsinchu (TW)

(72) Inventors: Shang-Lun Tsai, Hsinchu City (TW); Shuo-Mao Chen, New Taipei City (TW); Monsen Liu, Hsinchu (TW); Po-Ying Lai, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 597 days.

(21) Appl. No.: 17/723,622

(22) Filed: Apr. 19, 2022

(65) Prior Publication Data

US 2022/0406723 A1 Dec. 22, 2022

Related U.S. Application Data

(60) Provisional application No. 63/212,134, filed on Jun. 18, 2021.

(51) Int. Cl.
| | |
|---|---|
| *H10W 70/05* | (2026.01) |
| *H10W 70/60* | (2026.01) |
| *H10W 70/65* | (2026.01) |
| *H10W 70/685* | (2026.01) |
| *H10W 90/00* | (2026.01) |
| *H10W 70/695* | (2026.01) |
| *H10W 74/15* | (2026.01) |

(52) U.S. Cl.
CPC .......... *H10W 70/65* (2026.01); *H10W 70/05* (2026.01); *H10W 70/095* (2026.01); *H10W 70/611* (2026.01); *H10W 70/685* (2026.01); *H10W 90/401* (2026.01); *H10W 90/701* (2026.01); *H10W 70/695* (2026.01); *H10W 74/15* (2026.01); *H10W 90/00* (2026.01); *H10W 90/724* (2026.01); *H10W 90/734* (2026.01)

(58) Field of Classification Search
CPC ........... H01L 23/5386; H01L 23/49822; H01L 23/49833; H01L 2224/0233; H01L 2225/1041
USPC ........................................ 257/773, 786, 758
See application file for complete search history.

(56) References Cited

U.S. PATENT DOCUMENTS

| | | | | |
|---|---|---|---|---|
| 5,539,255 A | * | 7/1996 | Cronin | .............. H01L 21/76897 |
| | | | | 257/E21.507 |
| 2001/0013657 A1 | * | 8/2001 | Anand | .................... H01L 24/05 |
| | | | | 438/614 |
| 2002/0197458 A1 | * | 12/2002 | Peng | ....................... H01L 24/48 |
| | | | | 428/209 |
| 2006/0065969 A1 | * | 3/2006 | Antol | ...................... H01L 24/48 |
| | | | | 257/786 |

(Continued)

*Primary Examiner* — Trang Q Tran
(74) *Attorney, Agent, or Firm* — The Marbury Law Group, PLLC

(57) ABSTRACT

An interposer may include a first metal trace located on a first dielectric layer, a second dielectric layer located on the first dielectric layer, a line-shaped via located in the second dielectric layer and connected to the first metal trace, and a second metal trace located on the second dielectric layer and connected to the line-shaped via.

20 Claims, 19 Drawing Sheets

(56) References Cited

U.S. PATENT DOCUMENTS

| | | | |
|---|---|---|---|
| 2013/0200528 A1* | 8/2013 | Lin | H01L 24/97 |
| | | | 257/774 |
| 2019/0237366 A1* | 8/2019 | Yang | H01L 21/76807 |
| 2020/0006236 A1* | 1/2020 | Collins | H01L 23/481 |
| 2020/0075478 A1* | 3/2020 | Kim | H01L 23/5283 |
| 2020/0203273 A1* | 6/2020 | Cosemans | H01L 21/76808 |
| 2020/0395281 A1* | 12/2020 | Chien | H01L 23/49822 |
| 2021/0305189 A1* | 9/2021 | Jin | H01L 24/14 |
| 2021/0407904 A1* | 12/2021 | Liang | H01L 21/76805 |

* cited by examiner

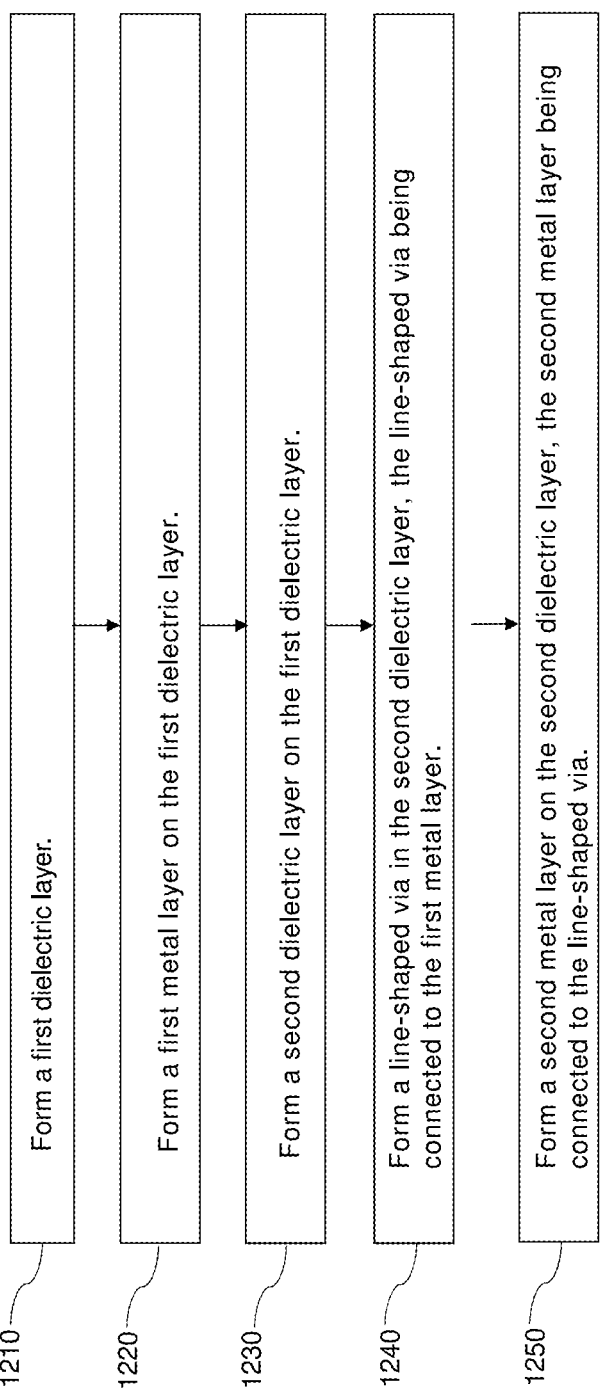

1210　Form a first dielectric layer.

1220　Form a first metal layer on the first dielectric layer.

1230　Form a second dielectric layer on the first dielectric layer.

1240　Form a line-shaped via in the second dielectric layer, the line-shaped via being connected to the first metal layer.

1250　Form a second metal layer on the second dielectric layer, the second metal layer being connected to the line-shaped via.

FIG. 12

INTERPOSER VIA INTERCONNECT SHAPES WITH IMPROVED PERFORMANCE CHARACTERISTICS AND METHODS OF FORMING THE SAME

RELATED APPLICATIONS

This application claims the benefit of priority from U.S. Provisional Application No. 63/212,134, entitled "New structure for polymer opening for Organic Interposer" filed on Jun. 18, 2021, the entire contents of which are incorporated herein by reference for all purposes.

BACKGROUND

A redistribution layer (RDL) structure is an important aspect of three-dimensional integrated circuit (3DIC) integration, especially for 2.5D IC integration with a passive interposer. The RDL structure may allow for fan-out of the integrated circuit and may allow for lateral communication in the integrated circuit, such as between semiconductor chips mounted on an interposer. The RDL structure may include, for example, a plurality of metal traces (e.g., metal layers) that may be formed in plurality of dielectric layers and connected together by interconnect structures, such as vias and conductive lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flowchart illustrating a method of forming a semiconductor device (e.g., interposer, RDL structure, InFO structure) according to an embodiment of the present disclosure.

DETAILED DESCRIPTION

Figure 1:
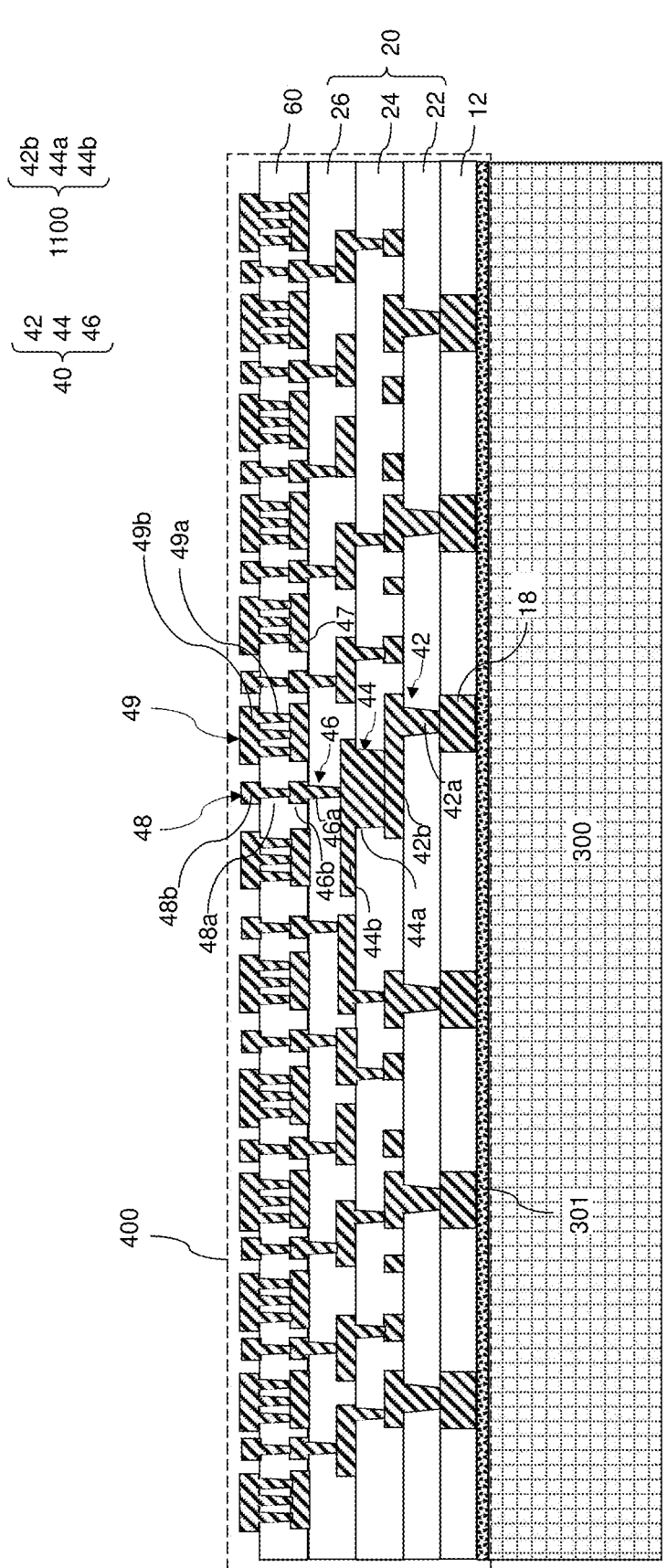
FIG. 1 is a vertical cross-sectional view of an interposer (e.g., organic interposer) formed on a carrier substrate according to an embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

One or more embodiments of the present invention may provide a via structure for an opening (e.g., an enhanced shape opening) in a layer such as a dielectric layer, a polymer layer, a glass layer, semiconductor layer, etc. The opening may be utilized, for example, in a redistribution layer (RDL) structure, an integrated fan-out (InFO) structure or an interposer (e.g., an organic interposer) to enhance power integrity and thermal performance for an integrated circuit such as a three-dimensional integrated circuit (3DIC). The opening may be useful in fabrication of an RDL structure, InFO structure or interposer as a part of an integrated circuit device including a system on chip (SOC) device, high bandwidth memory (HDM) or a system on integrated chips (SOIC) device.

The opening could also be used, for example, to form a via between two metal traces (e.g., conductive traces, metal layers) in a semiconductor layer (e.g., silicon wafer). In some embodiments, the opening may be used in forming an interconnection for complementary metal oxide semiconductor (CMOS) devices, logic devices, DRAM devices, etc. The opening may be used in place of the conventional openings (e.g., circular or square-shaped openings) that may be used in the fabrication of such devices.

Figure 10:
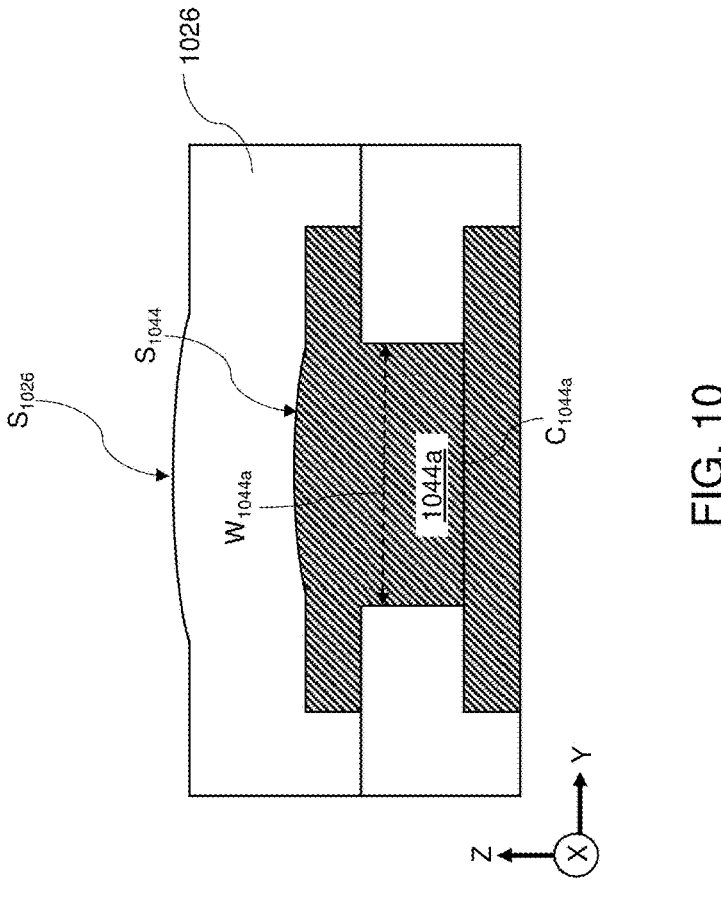
FIG. 10 is a vertical cross-sectional view of a comparative example with a circular-shaped via.

In conventional structures, an opening in a dielectric layer may have a circular shape or square shape, so that a metal via formed in the opening between two metal traces may have the shape of a solid circular cylinder or a solid square cylinder. A problem with the conventional structures is that the via size may be limited. In particular, in instances in which a circular opening or square opening is too wide, then a via formed in the opening may have a convex surface instead of the desired flat surface, as illustrated in FIG. 10. In addition, the via-to-via space may be defined (e.g., restricted) by rule and thus, the total polymer area that can be used to form the opening may be limited. Further, a via formed in the conventional circular opening or square opening may provide limited power integrity and limited thermal performance.

In one or more embodiments of the present invention, an interposer may include a first metal trace (e.g., first conductive trace) located on a first dielectric layer, a second dielectric layer located on the first dielectric layer, a line-shaped via located in the second dielectric layer (e.g., in an opening formed in the second dielectric layer) and connected to the first metal trace, and a second metal trace (e.g., second conductive trace) located on the second dielectric layer and connected to the line-shaped via. The line-shaped via may be formed in an enhanced shape opening having an enhanced shape such as a strip shape, an L-shape, a U-shape, an H-shape (e.g., a balbis shape), a circular ring shape (e.g., a toroidal shape with a square-shaped cross-section), or a rectangular ring shape (e.g., square ring shape) and, thus, the line-shaped via may have the enhanced shape.

The various embodiments of the present invention may have the advantage of providing several shapes of openings formed in various types of layers (e.g., polymer layers, silicon layers, etc.) that may have a larger opening area and therefore provide a greater contact surface area between two metal traces, while providing a flat top surface of a via formed in the opening. By increasing the connection area between two metal wires, the via may also provide improved power integrity and improved thermal performance in the device in which the opening is used.

FIG. 1 is a vertical cross-sectional view of an interposer 400 (e.g., organic interposer) formed on a carrier substrate 300 according to an embodiment of the present invention. A two-dimensional array of interposers 400 may be formed on the carrier substrate 300. The carrier substrate 300 may be a circular wafer or a rectangular wafer. The lateral dimensions (such as the diameter of a circular wafer or a side of a rectangular wafer) of the carrier substrate 300 may be in a range from 100 mm to 500 mm, such as from 200 mm to 400 mm, although lesser and greater lateral dimensions may also be used. The carrier substrate 300 may include a semiconductor substrate, an insulating substrate, or a conductive substrate. The carrier substrate 300 may be transparent or opaque. The thickness of the carrier substrate 300 may be sufficient to provide mechanical support to an array of interposers 400 to be formed thereupon. For example, the thickness of the carrier substrate 300 may be in a range from 60 microns to 1 mm, although lesser and greater thicknesses may also be used.

An adhesive layer 301 may be applied to the top surface of the carrier substrate 300. In one embodiment, the carrier substrate 300 may include an optically transparent material such as glass or sapphire. In this embodiment, the adhesive layer 301 may include a light-to-heat conversion (LTHC) layer. The LTHC layer is a solvent-based coating applied using a spin coating method. The LTHC layer may form a layer that converts ultraviolet light to heat such that the LTHC layer loses adhesion. For example, the LTHC layer may include Light-To-Heat Conversion Release Coating (LTHC) Ink™ that is commercially available from the 3M Company™. Alternatively, the adhesive layer 301 may include a thermally decomposing adhesive material. For example, the adhesive layer 301 may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

Metallic bonding structures 18 may be formed over the adhesive layer 301. The metallic bonding structures 18 may be used to provide bonding to a package substrate, and thus, may be herein referred to as package-side metallic bonding structures 18. The package-side metallic bonding structures 18 may include any metallic material that may be bonded to a solder material. For example, an underbump metallurgy (UBM) layer stack may be deposited over the adhesive layer 301. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack comprise the package-side metallic bonding structures 18. In one embodiment, the package-side metallic bonding structures 18 may be arranged as a two-dimensional array, which may be a two-dimensional periodic array such as a rectangular periodic array. In one embodiment, the package-side metallic bonding structures 18 may be formed as controlled collapse chip connection (C4) bump structures.

A dielectric layer 12, which may be herein referred to as a proximal dielectric layer 12, may be deposited over the package-side metallic bonding structures 18. The proximal dielectric layer 12 may include a dielectric polymer material such as polyimide (PI), benzocyclobutene (BCB), or polybenzobisoxazole (PBO). Other suitable materials are within the contemplated scope of disclosure. The thickness of the proximal dielectric layer 12 may be in a range from 4 microns to 60 microns, although lesser and greater thicknesses may also be used.

A plurality of redistribution metal interconnect structures 42, 44, 46 and additional dielectric layers 22, 24, 26 may be formed over the package-side metallic bonding structures 18 and the proximal dielectric layer 12. The additional dielectric layers may be herein referred to collectively as interconnect-level dielectric layers 20. The interconnect-level dielectric layers 20 may include a plurality of dielectric layers (22, 24, 26) such as a first dielectric layer 22, a second dielectric layer 24, and a third dielectric layer 26. While the present disclosure is described using an embodiment in which three dielectric layers (22, 24, 26) embed the redistribution metal interconnect structures (42, 44, 46), embodiments are expressly contemplated herein in which the interconnect-level dielectric layers 20 include two, four, or five or more dielectric layers.

The redistribution metal interconnect structures 40 may include multiple levels of redistribution metal interconnect structures (e.g., 42, 44, 46) that may be formed through a respective one of the dielectric layers (e.g., 22, 24, 26). The redistribution metal interconnect structures 40 may include metal via structures, metal line structures, and/or integrated line and via structures. Each integrated line and via structure may include a unitary structure containing a metal line structure and at least one metal via structure. A unitary structure refers to a single continuous structure in which each point within the structure may be connected by a continuous line (which may or may not be straight) that extends only within the structure.

In an illustrative example, the redistribution metal interconnect structures 40 may include a first redistribution metal interconnect structure 42 that may be formed through, and/or on a top surface of, the first dielectric layer 22, a second redistribution metal interconnect structure 44 that may be formed through, and/or on a top surface of, the second dielectric layer 24, and a third redistribution metal interconnect structure 46 that may be formed through, and/or on a top surface of, the third dielectric layer 26. While the present disclosure is described using an embodiment in which the first redistribution metal interconnect structures 40 may be embedded within three dielectric layers (22, 24, 26), embodiments are expressly contemplated herein in which the first redistribution metal interconnect structures 40 may be embedded within one, two, or four or more dielectric layers.

As illustrated in FIG. 1, the first redistribution metal interconnect structure 42 may include via 42a and metal trace 42b which may be referred to herein as first metal trace 42b. The second redistribution metal interconnect structure 44 may include via 44a which may be referred to as line-shaped via 44a and metal trace 44b which may be referred to herein as second metal trace 44b. The third redistribution metal interconnect structure 46 may include via 46a and metal trace 46b.

The first metal trace 42b and the second redistribution metal interconnect structure 44 (i.e., line-shaped via 44a and second metal trace 44b) together may constitute a redistribution layer structure 1100. The interposer 400 may include a plurality of the redistribution layer structures 1100.

The line-shaped via 44a may be formed in a line-shaped opening in the second dielectric layer 24. The line-shaped opening may include one or more lines and may have a line shape (e.g., an enhanced shape) such as a strip shape, an L-shape, a U-shape, an H-shape, a circular ring shape, and a rectangular ring shape. The line-shaped via 44a may be formed in the line-shaped opening and may, therefore, also have a line shape such as a strip shape, an L-shape, a U-shape, an H-shape, a circular ring shape or a rectangular ring shape. Other suitable line shapes are within the contemplated scope of disclosure.

The line-shaped via 44a may provide a greater contact surface area between first metal trace 42b and second metal trace 44b, and may have a flat top surface unlike a solid circular-shaped via or solid square-shaped via. Since heat can be effectively transferred through a greater contact area, the line-shaped via 44a may therefore, provide improved power integrity and improved thermal performance in the device in which the interposer 400 may be used. The interposer 400 may include a plurality of line-shaped vias similar to the line-shaped via 44a.

Referring again to FIG. 1, each of the interconnect-level dielectric layers 20 may include a dielectric polymer material such as polyimide (PI), benzocyclobutene (BCB), or polybenzobisoxazole (PBO). Other suitable materials are within the contemplated scope of disclosure. The thickness of each interconnect-level dielectric layer 20 may be in a range from 4 microns to 20 microns, although lesser and greater thicknesses may also be used. Each of the redistribution metal interconnect structures 40 may include at least one metallic material such as Cu, Al, Mo, Co, Ru, W, TiN, TaN, WN, or a combination or a stack thereof. Other suitable materials are within the contemplated scope of disclosure. For example, each of the redistribution metal interconnect structures 40 may include a layer stack of a TiN layer and a Cu layer. In embodiments in which a redistribution metal interconnect structure 40 includes a metal line structure, the thickness of the metal line structure may be in a range from 2 microns to 20 microns, although lesser and greater thicknesses may also be used.

The third redistribution metal interconnect structure 46 may be located at a topmost metal interconnect level. The metal trace 46b of the third redistribution metal interconnect structure 46 may be referred to herein as a metallic pad structure 46b. The metallic pad structure 46b may be formed in the areas in which die-side metallic bonding structures 48 may be subsequently formed. In one embodiment, the metallic pad structures 46b may be formed as a two-dimensional array.

A metallic base plate 47 may be formed at the same level as the metallic pad structure 46b. The shape of each metallic base plate 47 may be selected such that each metallic base plate 47 laterally surrounds at least one metallic pad structure 46b.

An additional dielectric layer may be deposited over the metallic pad structure 46b and the metallic base plate 47. The additional dielectric layer may be herein referred to as a distal dielectric layer 60. The distal dielectric layer 60 may include a dielectric polymer material such as polyimide (PI), benzocyclobutene (BCB), or polybenzobisoxazole (PBO). Other suitable materials are within the contemplated scope of disclosure. The thickness of the distal dielectric layer 60 may be in a range from 4 microns to 60 microns, such as from 8 microns to 30 microns, although lesser and greater thicknesses may also be used. The proximal dielectric layer 12, the interconnect-level dielectric layer 20, and the distal dielectric layer 60 are collectively referred to as dielectric layers (12, 20, 60).

A photoresist layer may be applied over the distal dielectric layer 60, and may be lithographically patterned to form discrete openings therethrough. The openings in the photoresist layer include a first opening that overlies the metallic pad structure 46b and a second opening that overlies the metallic base plate 47. An anisotropic etch process may be performed to transfer the pattern of the openings in the photoresist layer through the distal dielectric layer 60. A first via cavity and second via cavity may be formed through the distal dielectric layer 60. The first via cavity may extend to a top surface of the metallic pad structure 46b, and the second via cavity may extend to a top surface of the metallic base plate 47.

A metallic material may be deposited in the first via cavity and the second via cavity and over the top surface of the distal dielectric layer 60. The metallic material may include any metallic material that may be bonded to a solder material. For example, the metallic material may include an underbump metallurgy (UBM) layer stack. The order of material layers within the UBM layer stack is selected such that solder material portions may be subsequently bonded to portions of the top surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

A photoresist layer may be applied over the metallic material, and may be lithographically patterned to cover a discrete area overlying the first via cavity, and a discrete area overlying the second via cavity. An etch process may be performed to remove unmasked portions of the metallic material. First patterned portions of the metallic material in and over the first via cavity may include a die-side bonding structure 48. Second patterned portions of the metallic material in and over the second via cavity may include metallic support structure 49. The die-side bonding structure 48 and the metallic support structure 49 may be collectively referred to as bonding-level metallic structures.

The die-side bonding structures 48 may include a respective first unitary structure containing a die-side metallic bonding structure 48b and a bump connection via structure 48a that may be electrically connected to a respective one of the redistribution metal interconnect structures 40. Each die-side metallic bonding structure 48b may be a patterned portion of a UBM layer stack that remains over a horizontal plane including the top surface of the distal dielectric layer 60, and each bump connection via structure 48a may be a patterned portion of the UBM layer stack that remains below the horizontal plane including the top surface of the distal dielectric layer 60. In one embodiment, each combination within the die-side metallic bonding structures 48b and the bump connection via structures 48a may include a respective first unitary structure in which a first conductive material portion continuously extends across a respective die-side metallic bonding structure 48b and a respective bump connection via structure 48a.

In one embodiment, the metallic support structure 49 may include a respective second unitary structure containing a metallic shield structure 49b and a shield support via structure 49a contacting a respective metallic base plate 47. Each metallic shield structure 49b may be a patterned portion of a UBM layer stack that remains over a horizontal plane including the top surface of the distal dielectric layer 60, and each shield support via structure 49a may be a patterned portion of the UBM layer stack that remains below the horizontal plane including the top surface of the distal dielectric layer 60. In one embodiment, each combination within the metallic shield structure 49b and the shield support via structures 49a may include a respective second unitary structure in which a second conductive material portion continuously extends across a respective metallic shield structure 49b and a respective plurality of shield support via structures 49a. Each shield support via structure 49a may provide mechanical support to a respective metallic shield structure 49b when pressure is applied to the metallic shield structure 49b (such as application of an underfill material in a subsequent processing step).

Figure 2:
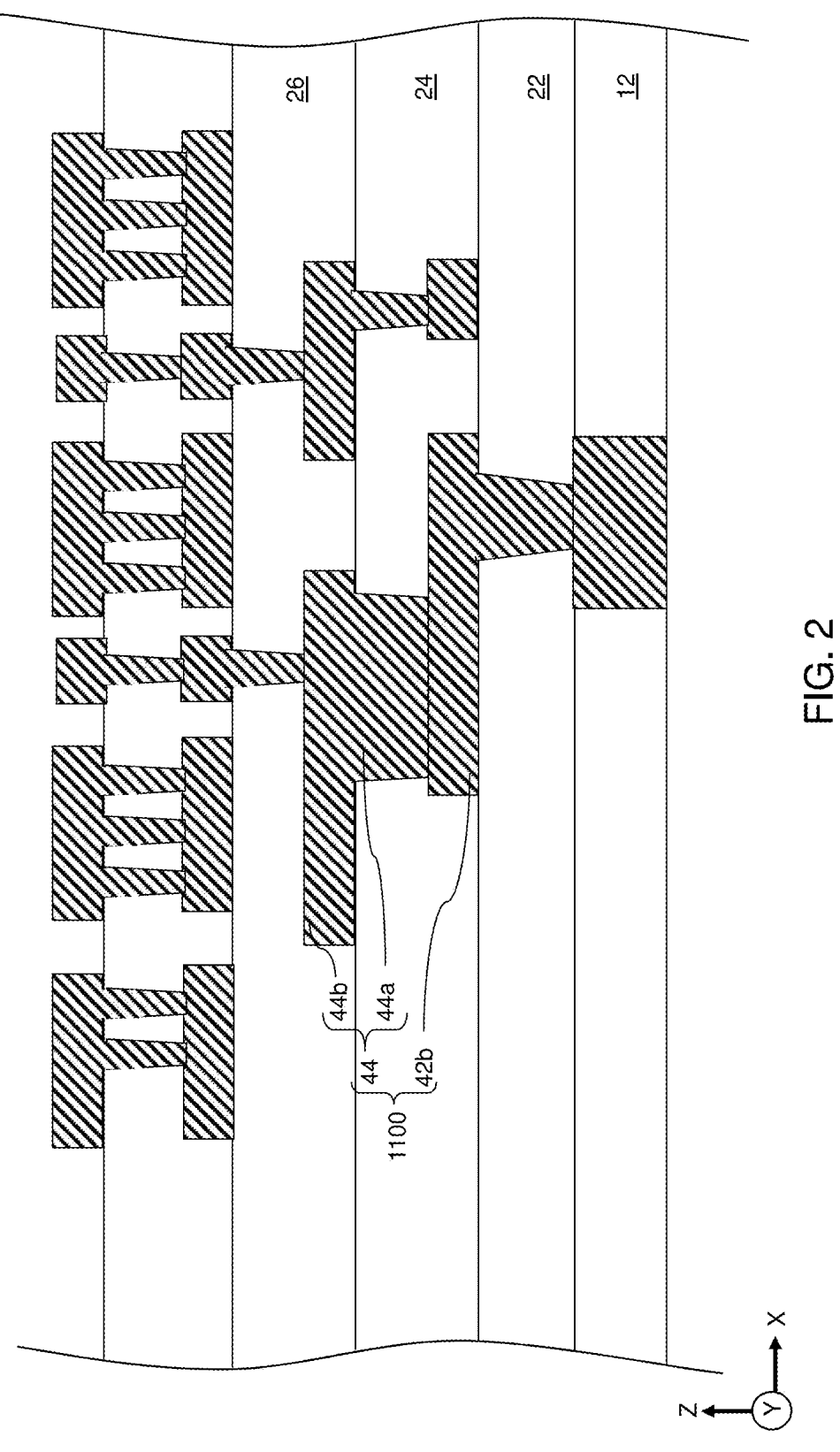
FIG. 2 is a magnified vertical cross-sectional view of a portion of the interposer according to one or more embodiments.

FIG. 2 is a magnified vertical cross-sectional view of a portion of the interposer 400 including the redistribution layer structure 1100 according to one or more embodiments. As illustrated in FIG. 2, the line-shaped via 44a may contact the first metal trace 42b that may be located in the second dielectric layer 24, and may contact the second metal trace 44b that may be located in the third dielectric layer 26. The line-shaped via 44a may be formed as a unit with second metal trace 44b in the second redistribution metal interconnect structure 44.

The line-shaped via 44a may include a via width (e.g., an overall width in the y-direction in FIG. 2) in a range of 10 μm to 1000 μm, a via length (e.g., an overall length in the x-direction in FIG. 2) in a range of 10 μm to 1000 μm, and a via height (e.g., a thickness or depth in the z-direction in FIG. 2) in a range of 1 μm to 20 μm. The first metal trace 42b and the second metal trace 44b may extend longitudinally in a first direction (the x-direction in FIG. 2), and the line-shaped via 44a may contact the first metal trace 42b and the second metal trace 44b over an entirety of the via length of the line-shaped via 44a and over an entirety of the via width of the line-shaped via 44a. The line-shaped via 44a may have a thickness that is greater than a thickness of the first metal trace 42b and greater than a thickness of the second metal trace 44b. The line-shaped via 44a may also include one line or a plurality of lines that may be connected. The one or more lines may have a line length in the first direction (the x-direction in FIG. 2) of at least 10 μm, a line width in a second direction (the y-direction in FIG. 2) of not greater than 20 μm, and a line depth in a third direction (the z-direction in FIG. 2) in a range of 1 μm to 20 μm. The line depth may be greater than the line width and a ratio of the line length to the line width may be in a range from about 3:1 to about 20:1. The line-shaped via 44*a* may include, for example, a horizontal (i.e., in the x-y plane) cross-sectional strip shape, L-shape, U-shape, H-shape, circular ring shape and rectangular ring shape. Other suitable horizontal cross-sectional (i.e., in the x-y plane) shapes are within the contemplated scope of disclosure.

Figure 3B:
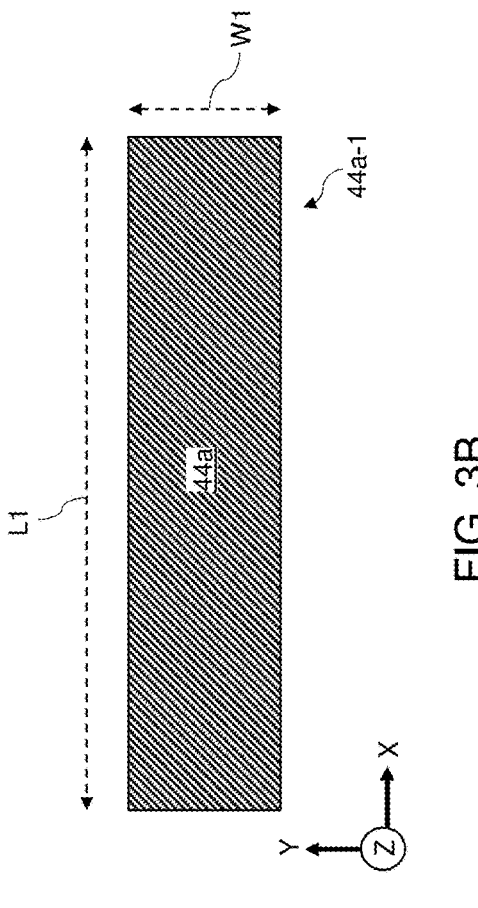
FIG. 3B is a horizontal cross-sectional view of the line-shaped via in FIG. 3A across a contact surface according to one or more embodiments.
Figure 3A:
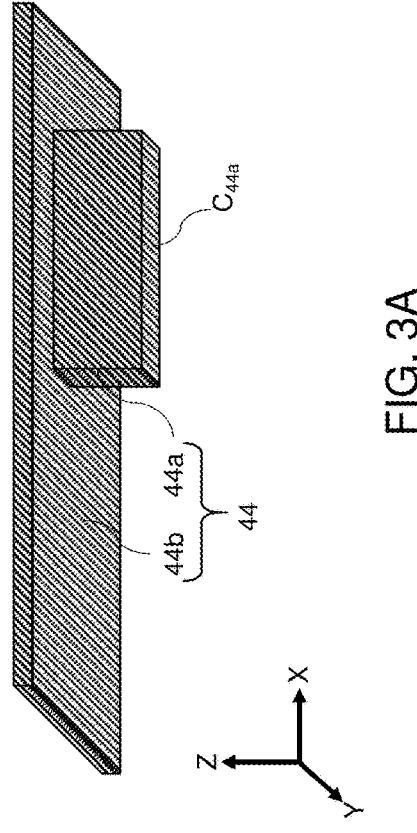
FIG. 3A is a perspective view of a line-shaped via of a second redistribution metal interconnect structure according to one or more embodiments.

FIG. 3A is a perspective view of a second redistribution metal interconnect structure 44 including a line-shaped via 44*a* according to one or more embodiments. As illustrated in FIG. 3A, the line-shaped via 44*a* may include a straight metal bar and have a horizontal (i.e., in the x-y plane) cross-sectional "I" shape (e.g., a straight-line shape) and be formed as a unit with the second metal trace 44*b* in the second redistribution metal interconnect structure 44. The line-shaped via 44*a* of the second redistribution metal interconnect structure 44 may include a contact surface $C_{44_a}$ that may contact an upper surface of the first metal trace 42*b*.

FIG. 3B is a horizontal cross-sectional view of the line-shaped via 44*a* in FIG. 3A across the contact surface $C_{44_a}$ according to one or more embodiments. As illustrated in FIG. 3B, the line-shaped via 44*a* in FIG. 3A may include a line 44*a*-1 having a length L1 in the x-direction and a width W1 in the y-direction. An area A of the contact surface $C_{44_a}$ of the line-shaped via 44*a* may be given by A=L1×W1. Thus, the line-shaped via 44*a* of FIGS. 3A-3B may include a straight metal bar (44*a*-1), a ratio of length to width of the straight metal bar being in a range from 3:1 to 20:1.

Figures 4A, 4B:
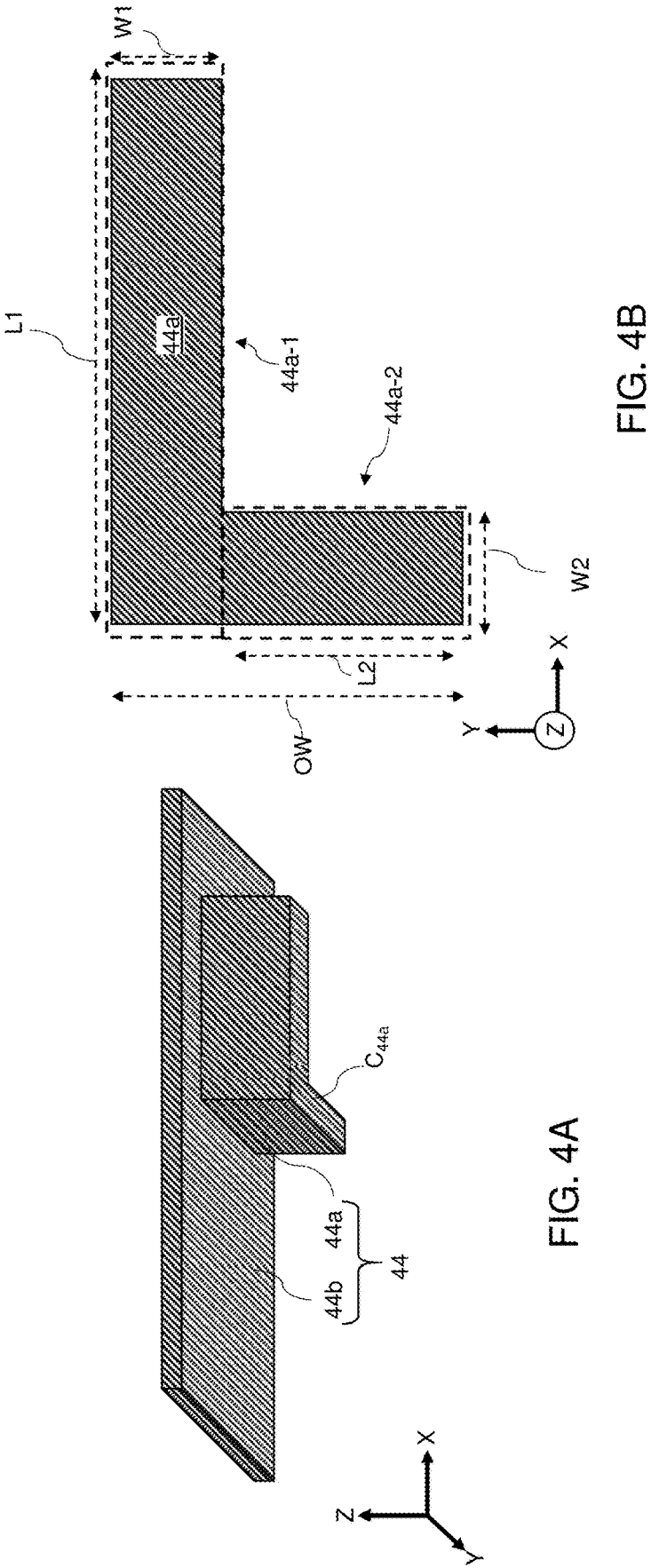
FIG. 4A is a perspective view of a line-shaped via of a second redistribution metal interconnect structure according to one or more embodiments.
FIG. 4B is a horizontal cross-sectional view of the line-shaped via in FIG. 4A across the contact surface according to one or more embodiments.

FIG. 4A is a perspective view of a second redistribution metal interconnect structure 44 including a line-shaped via 44*a* according to one or more embodiments. As illustrated in FIG. 4A, the line-shaped via 44*a* may include a plurality of metal bars and have a corner shape (e.g., a horizontal cross-sectional "L" shape) and be formed as a unit with the second metal trace 44*b* in the second redistribution metal interconnect structure 44. The line-shaped via 44*a* of the second redistribution metal interconnect structure 44 may include a contact surface $C_{44_a}$ that may contact an upper surface of the first metal trace 42*b*.

FIG. 4B is a horizontal cross-sectional view of the line-shaped via 44*a* in FIG. 4A across the contact surface $C_{44_a}$ according to one or more embodiments. As illustrated in FIG. 4B, the line-shaped via 44*a* in FIG. 4A may include a first line 44*a*-1 having a length L1 in the x-direction and a width W1 in the y-direction, and a second line 44*a*-2 having a length L2 in the y-direction and a width W2 in the x-direction. The lengths (L1, L2) of the lines (44*a*-1, 44*a*-2) may be the same or different, and the widths (W1, W2) of the lines (44*a*-1, 44*a*-2) may be the same or different. The line-shaped via 44*a* in FIG. 4A may also have an overall width (OW) in the y direction of OW=W1+L2. Further, an area A of the contact surface $C_{44_a}$ of the line-shaped via 44*a* may be given by A=((L1×W1)+(L2×W2)). Thus, the line-shaped via 44*a* of FIGS. 4A-4B may include a plurality of metal bars including a first metal bar (44*a*-1) and a second metal bar (44*a*-2) that is perpendicularly connected to an end of the first metal bar (44*a*-1), a ratio of length to width of at least one metal bar of the plurality of metal bars being in a range from 3:1 to 20:1.

Figures 5A, 5B:
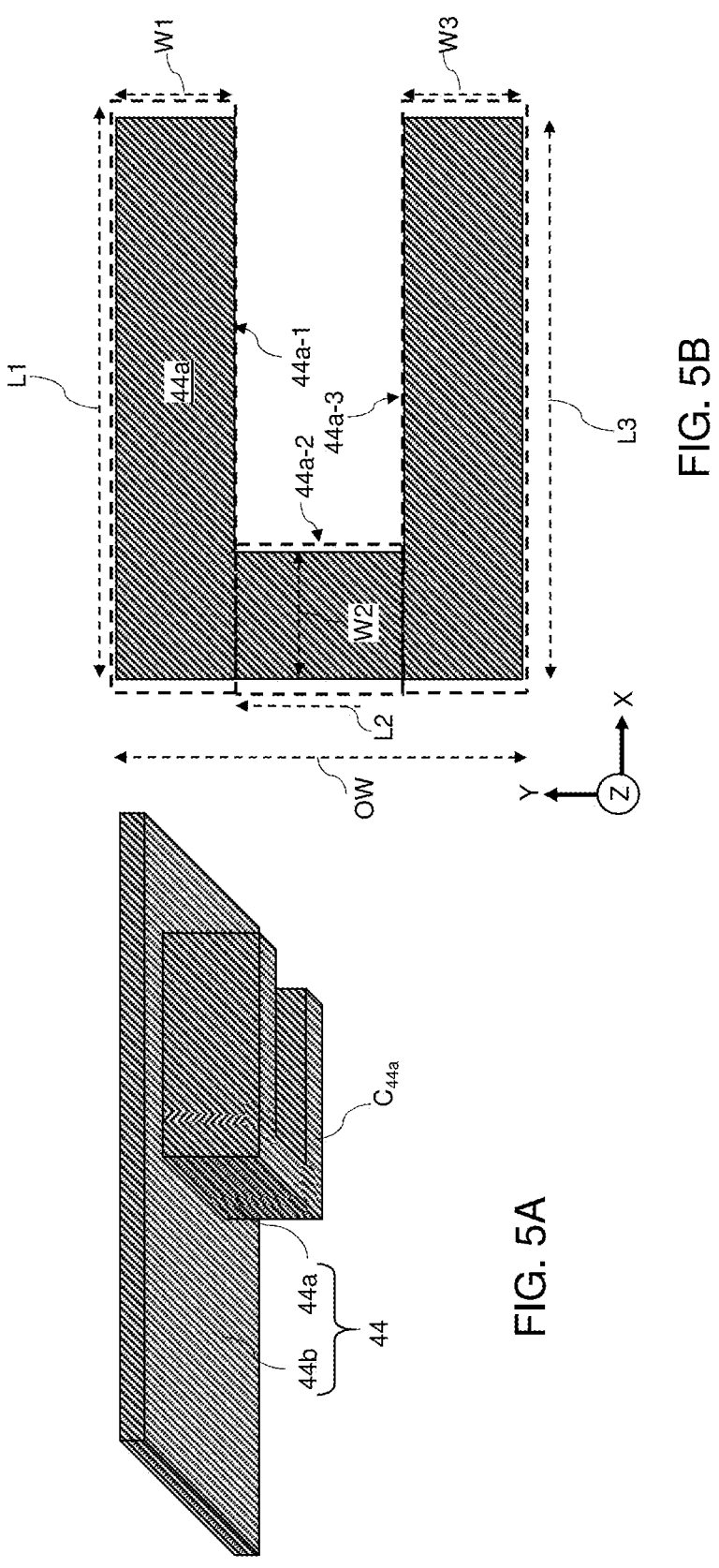
FIG. 5A is a perspective view of a line-shaped via of a second redistribution metal interconnect structure according to one or more embodiments.
FIG. 5B is a horizontal cross-sectional view of the line-shaped via in FIG. 5A across the contact surface according to one or more embodiments.

FIG. 5A is a perspective view of a second redistribution metal interconnect structure 44 including a line-shaped via 44*a* according to one or more embodiments. As illustrated in FIG. 5A, the line-shaped via 44*a* may include a plurality of metal bars and have a horizontal (i.e., in the x-y plane) cross-sectional "U" shape and be formed as a unit with the second metal trace 44*b* in the second redistribution metal interconnect structure 44. The line-shaped via 44*a* of the second redistribution metal interconnect structure 44 may include a contact surface $C_{44_a}$ that may contact an upper surface of the first metal trace 42*b*.

FIG. 5B is a horizontal cross-sectional view of the line-shaped via 44*a* in FIG. 5A across the contact surface $C_{44_a}$ according to one or more embodiments. As illustrated in FIG. 5B, the line-shaped via 44*a* in FIG. 5A may include a first line 44*a*-1 having a length L1 in the x-direction and a width W1 in the y-direction, a second line 44*a*-2 having a length L2 in the y-direction and a width W2 in the x-direction, and a third line 44*a*-3 having a length L3 in the x-direction and a width W3 in the y-direction. The lengths (L1, L2, L3) of the lines (44*a*-1, 44*a*-2, 44*a*-3) may be the same or different, and the widths (W1, W2, W3) of the lines (44*a*-1, 44*a*-2, 44*a*-3) may be the same or different. The line-shaped via 44*a* in FIG. 5A may also have an overall width (OW) in the y direction of OW=W1+L2+W3. Further, an area A of the contact surface $C_{44_a}$ of the line-shaped via 44*a* may be given by A=((L1×W1)+(L2×W2)+(L3×W3)). Thus, the line-shaped via 44*a* of FIGS. 5A-5B may include a plurality of metal bars including a first metal bar (44*a*-1), a second metal bar (44*a*-2) and a third metal bar (44*a*-3), the third metal bar (44*a*-3) being parallel to the first metal bar (44*a*-1), and the second metal bar (44*a*-2) being perpendicularly connected to an end of the first metal bar (44*a*-1) and to a corresponding end of the third metal bar (44*a*-3), a ratio of length to width of at least one metal bar of the plurality of metal bars being in a range from 3:1 to 20:1.

Figures 6A, 6B:
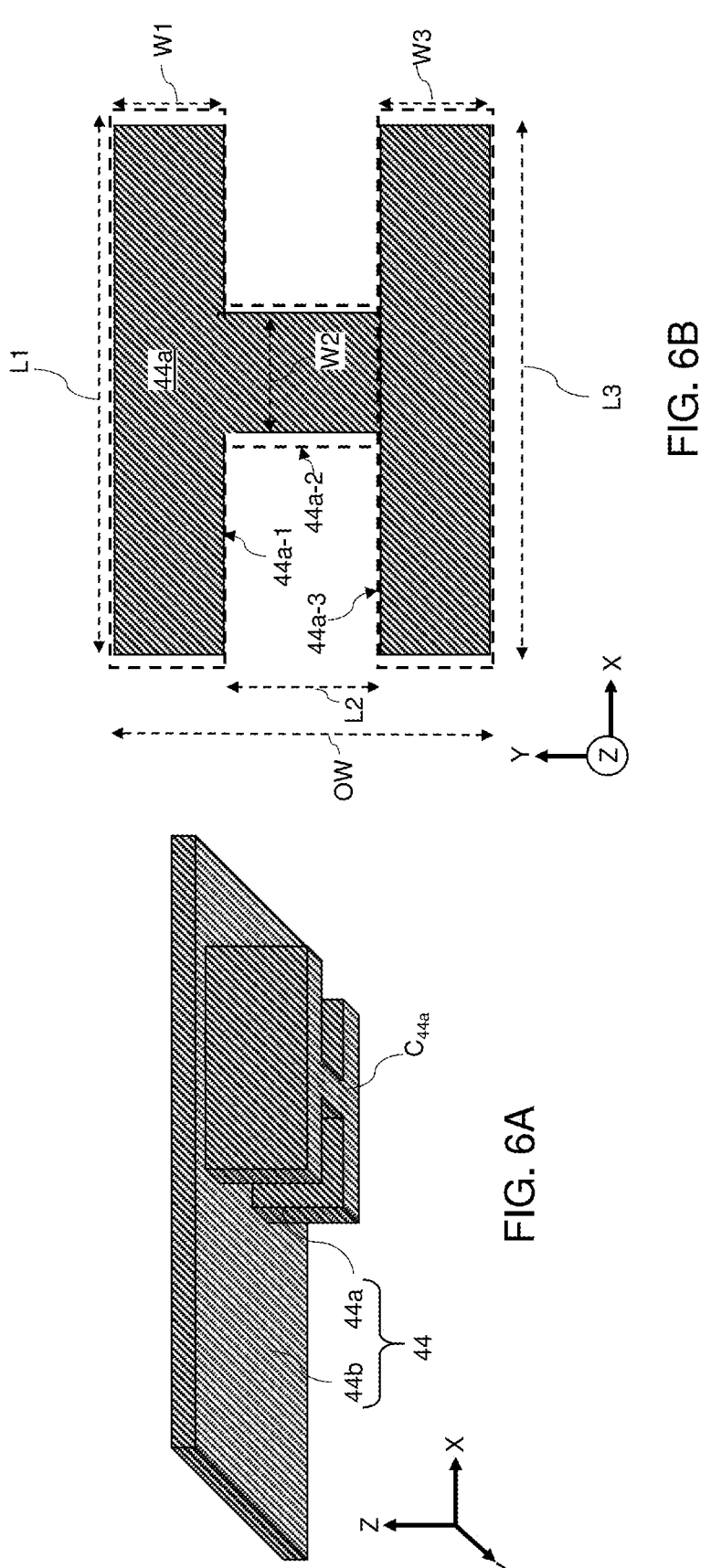
FIG. 6A is a perspective view of a line-shaped via of a second redistribution metal interconnect structure according to one or more embodiments.
FIG. 6B is a horizontal cross-sectional view of the line-shaped via in FIG. 6A across the contact surface according to one or more embodiments.

FIG. 6A is a perspective view of a second redistribution metal interconnect structure 44 including a line-shaped via 44*a* according to one or more embodiments. As illustrated in FIG. 6A, the line-shaped via 44*a* may include a plurality of metal bars and have a horizontal (i.e., in the x-y plane) cross-sectional "H" shape and be formed as a unit with the second metal trace 44*b* in the second redistribution metal interconnect structure 44. The line-shaped via 44*a* of the second redistribution metal interconnect structure 44 may include a contact surface $C_{44_a}$ that may contact an upper surface of the first metal trace 42*b*.

FIG. 6B is a horizontal cross-sectional view of the line-shaped via 44*a* in FIG. 6A across the contact surface $C_{44_a}$ according to one or more embodiments. As illustrated in FIG. 6B, the line-shaped via 44*a* in FIG. 6A may include a first line 44*a*-1 having a length L1 in the x-direction and a width W1 in the y-direction, a second line 44*a*-2 having a length L2 in the y-direction and a width W2 in the x-direction, and a third line 44*a*-3 having a length L3 in the x-direction and a width W3 in the y-direction. The lengths (L1, L2, L3) of the lines (44*a*-1, 44*a*-2, 44*a*-3) may be the same or different, and the widths (W1, W2, W3) of the lines (44*a*-1, 44*a*-2, 44*a*-3) may be the same or different. The line-shaped via 44*a* in FIG. 6A may also have an overall width (OW) in the y direction of OW=W1+L2+W3. Further, an area A of the contact surface $C_{44_a}$ of the line-shaped via 44*a* may be given by A=((L1×W1)+(L2×W2)+(L3×W3)). Thus, the line-shaped via 44*a* of FIGS. 6A-6B may include a plurality of metal bars including a first metal bar (44*a*-1), a second metal bar (44*a*-2) and a third metal bar (44*a*-3), the third metal bar (44*a*-3) being parallel to the first metal bar (44*a*-1), and the second metal bar (44*a*-2) being perpendicularly connected to a center of the first metal bar (44*a*-1) and to a center of the third metal bar (44*a*-3), a ratio of length to width of at least one metal bar of the plurality of metal bars being in a range from 3:1 to 20:1.

Figure 7B:
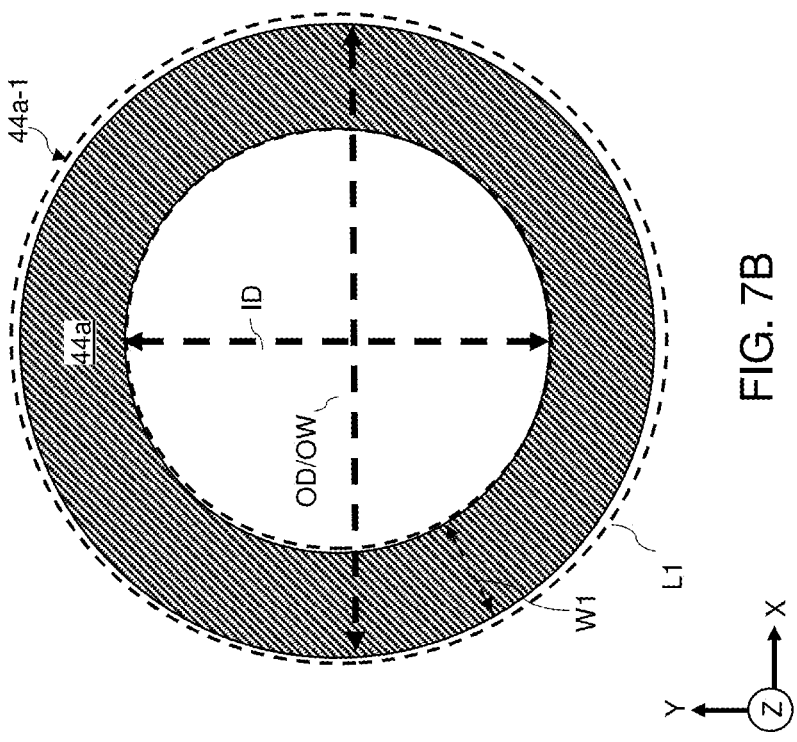
FIG. 7B is a horizontal cross-sectional view of the line-shaped via in FIG. 7A across the contact surface according to one or more embodiments.
Figure 7A:
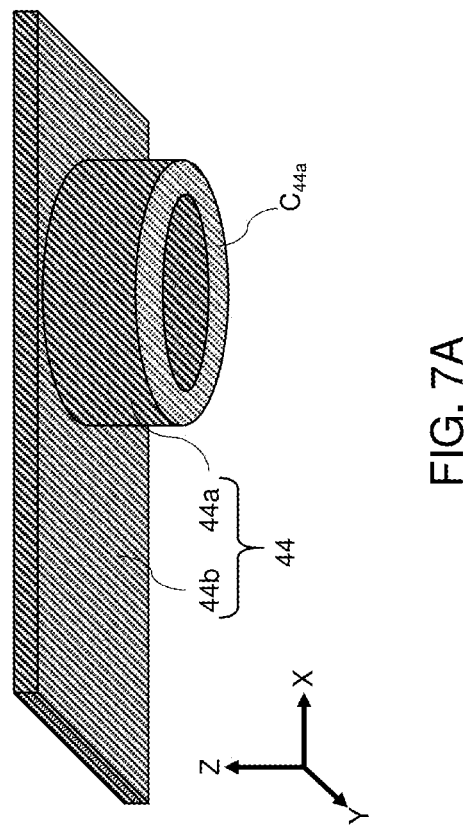
FIG. 7A is a perspective view of a line-shaped via of a second redistribution metal interconnect structure according to one or more embodiments.

FIG. 7A is a perspective view of a second redistribution metal interconnect structure 44 including a line-shaped via 44*a* according to one or more embodiments. As illustrated in FIG. 7A, the line-shaped via 44*a* may include a curved metal bar that is curved into a loop, a ratio of length to width of the curved metal bar being in a range from 3:1 to 20:1. That is, the line-shaped via 44*a* may have a horizontal cross-sectional "O" shape (e.g., an annular shape) and be formed as a unit with the second metal trace 44*b* in the second redistribution metal interconnect structure 44. The line-shaped via 44*a* of the second redistribution metal interconnect structure 44 may include a contact surface $C_{44a}$ that may contact an upper surface of the first metal trace 42*b*.

FIG. 7B is a horizontal cross-sectional view of the line-shaped via 44*a* in FIG. 7A across the contact surface $C_{44a}$ according to one or more embodiments. As illustrated in FIG. 7B, the line-shaped via 44*a* in FIG. 7A may include a first line 44*a*-1 that may be a curved line that forms an annular shape extending in both the x-direction and the y-direction. The first line 44*a*-1 may have an outer diameter OD and an inner diameter ID, and may have a width W1 that may be equal to the OD less the ID (e.g., W1=OD−ID). The first line 44*a*-1 may also have a length L1 that may be equal to a circumference of the annular shape. The line-shaped via 44*a* in FIG. 7A may also have an overall width OW that is equal to the outer diameter OD of the first line 44*a*-1. Further, an area of the contact surface $C_{44a}$ of the line-shaped via 44*a* may be given by the difference between the area of the circle with the outer diameter OD (i.e., π×(OD/2)²) minus the area of the circle with the inner diameter ID (i.e., π×(ID/2)²) e.g., (π×(OD/2)²−π×(ID/2)²). Thus, the line-shaped via 44*a* in FIGS. 7A-7B may include a curved metal bar (44*a*-1) that is curved into a loop, a ratio of length to width of the curved metal bar (44*a*-1) being in a range from 3:1 to 20:1.

Figure 8B:
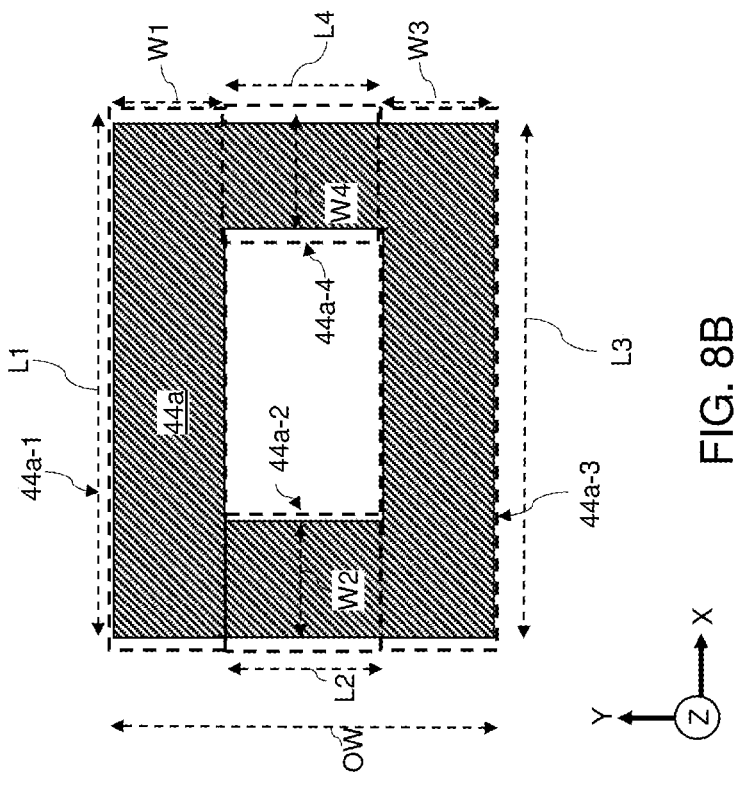
FIG. 8B is a horizontal cross-sectional view of the line-shaped via in FIG. 8A across the contact surface according to one or more embodiments.
Figure 8A:
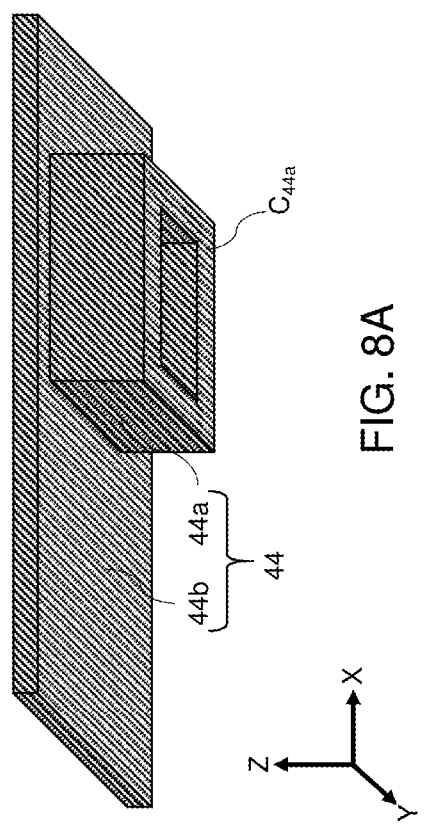
FIG. 8A is a perspective view of a line-shaped via of a second redistribution metal interconnect structure according to one or more embodiments.

FIG. 8A is a perspective view of a second redistribution metal interconnect structure 44 including a line-shaped via 44*a* according to one or more embodiments. As illustrated in FIG. 8A, the line-shaped via 44*a* may have a horizontal cross-sectional rectangular shape (e.g., square shape) and be formed as a unit with the second metal trace 44*b* in the second redistribution metal interconnect structure 44. The line-shaped via 44*a* of the second redistribution metal interconnect structure 44 may include a contact surface $C_{44a}$ that may contact an upper surface of the first metal trace 42*b*.

FIG. 8B is a horizontal cross-sectional view of the line-shaped via 44*a* in FIG. 8A across the contact surface $C_{44a}$ according to one or more embodiments. As illustrated in FIG. 8B, the line-shaped via 44*a* in FIG. 8A may include a first line 44*a*-1 having a length L1 in the x-direction and a width W1 in the y-direction, a second line 44*a*-2 having a length L2 in the y-direction and a width W2 in the x-direction, a third line 44*a*-3 having a length L3 in the x-direction and a width W3 in the y-direction, and a fourth line 44*a*-4 having a length L4 in the y-direction and a width W4 in the x-direction. The lengths (L1, L2, L3, L4) of the lines (44*a*-1, 44*a*-2, 44*a*-3, 44*a*-4) may be the same or different, and the widths (W1, W2, W3, W4) of the lines (44*a*-1, 44*a*-2, 44*a*-3, 44*a*-4) may be the same or different. The line-shaped via 44*a* in FIG. 8A may also have an overall width (OW) in the y direction of OW=W1+L2+W3 or OW=W1+L4+W3. Further, an area A of the contact surface $C_{44a}$ of the line-shaped via 44*a* may be given by A=((L1×W1)+(L2×W2)+(L3×W3)+(L4×W4)). Thus, the line-shaped via 44*a* in FIGS. 8A-8B may include a plurality of metal bars including a first metal bar (44*a*-1), a second metal bar (44*a*-2), a third metal bar (44*a*-3) and a fourth metal bar (44*a*-4), the third metal bar (44*a*-3) being parallel to the first metal bar (44*a*-1), the second metal bar (44*a*-2) being perpendicularly connected to a first end of the first metal bar (44*a*-1) and to a corresponding first end of the third metal bar (44*a*-3), and the fourth metal bar (44*a*-4) being perpendicularly connected to a second end of the first metal bar (44*a*-1) and to a corresponding second end of the third metal bar (44*a*-3), a ratio of length to width of at least one metal bar of the plurality of metal bars being in a range from 3:1 to 20:1.

Figure 9:
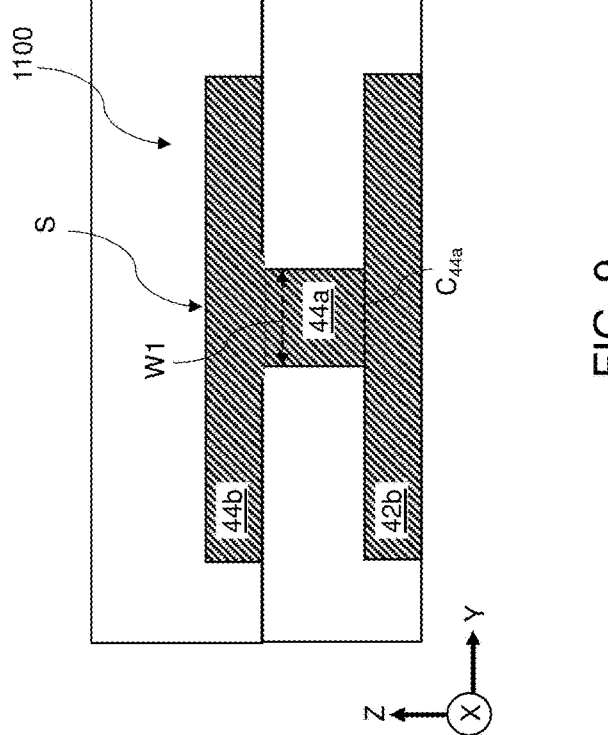
FIG. 9 is a vertical cross-sectional view of a line-shaped via according to one or more embodiments.

FIG. 9 is a vertical cross-sectional view of a redistribution layer structure 1100 including a line-shaped via 44*a* according to one or more embodiments. An embodiment of the present invention may help to ensure that an upper surface of the second metal trace 44*b* is substantially flat. For example, in instances in which the line-shaped via 44*a* includes a single line having a length (in the x-direction) of 100 μm and a width (in the y-direction) W1 of 10 μm, then the area of the contact surface $C_{44a}$ that contacts the first metal trace 42*b* would be 1000 μm². Thus, the line-shaped via 44*a* may be able to provide a relatively large contact surface area (1000 μm²) with a relatively narrow line width W1 (10 μm). Having such a relatively narrow line width W1 may help to ensure that an upper surface S of the second metal trace 44*b* may be substantially flat at a location over the line-shaped via 44*a*.

FIG. 10 is a vertical cross-sectional view of a comparative example with a solid circular-shaped via 1044*a*. In order to obtain an area of 1000 μm² for contact surface $C_{1044a}$, the circular-shaped via 1044*a* would need to have a relatively large width $W_{1044a}$ of 35.7 μm ($W_{1044a}$=2×√(1000/π)=35.7 μm). As a result of having such a large width $W_{1044a}$, an upper surface S1044 of a metal trace formed above may have an undesirable convex shape at a location over the circular-shaped via 1044*a*, and an upper surface S1026 of a dielectric layer 1026 in which the metal trace is formed may also have an undesirable convex shape at a location over the circular-shaped via 1044*a*. The convex shape of the upper surface 51026 may complicate a process (e.g., photolithographic process) to be performed on the dielectric layer 1026. The convex shape may also be transferred to additional dielectric layers formed on the dielectric layer 1026 and therefore, complicate a process to be performed on the additional dielectric layers. In contrast, a line-shaped via may provide the benefit of having a large surface area without resulting in the convex shape and therefore, without complicating a processing of any dielectric layers formed above the line shaped via.

FIGS. 11A-11F illustrate a method of forming a redistribution layer structure 1100 having a line-shaped via 44*a* according to one or more embodiments.

Figure 11A:
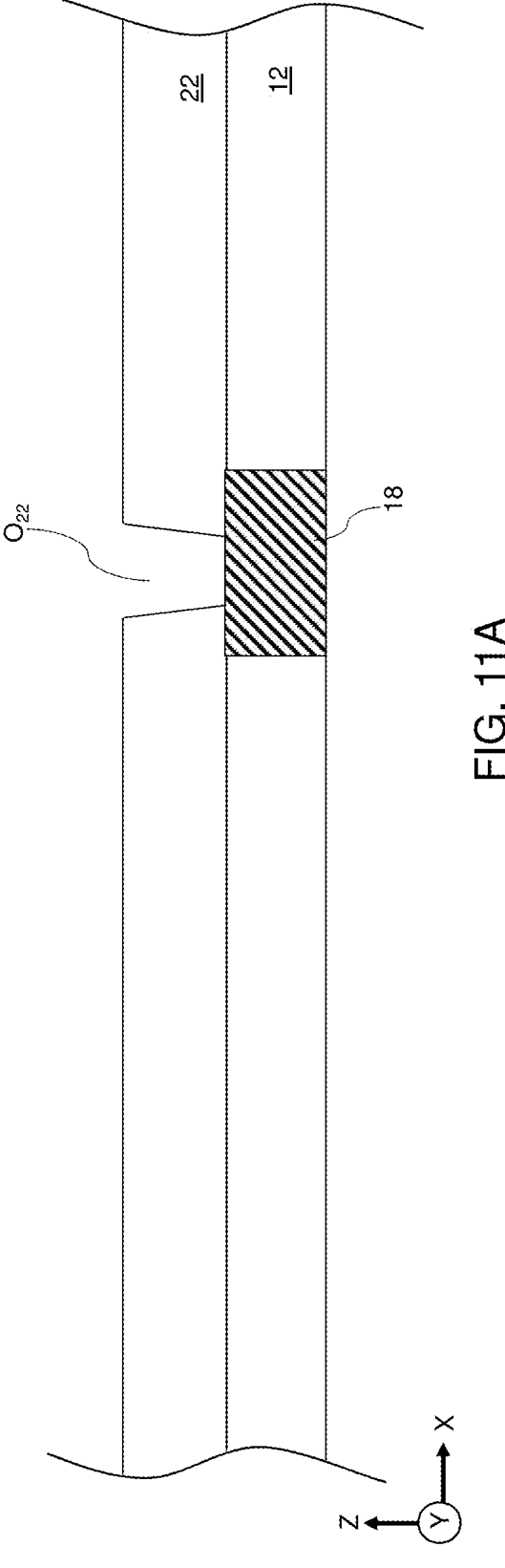
FIG. 11A is a vertical cross-sectional view of the exemplary intermediate structure after forming the first dielectric layer and the forming of an opening in the first dielectric layer according to an embodiment of the present disclosure.

FIG. 11A is a vertical cross-sectional view of the exemplary structure after forming the first dielectric layer 22 and the forming of an opening $O_{22}$ in the first dielectric layer 22 according to an embodiment of the present disclosure. The dielectric layer 22 may be formed, for example, of a dielectric polymer such as polybenzoxazole (PBO), polyimide, benzocyclobutene (BCB), or the like, that may be easily patterned using a photolithography process. Other suitable materials are within the contemplated scope of disclosure. The first dielectric layer 22 may be formed, for example, by spin coating, lamination or other suitable deposition technique. The thickness of the first dielectric layer 22 may be in a range from 2 microns to 20 microns, although lesser and greater thicknesses may also be used.

The opening $O_{22}$ may be formed in the first dielectric layer 22 so as to expose an upper surface of the package-side metallic bonding structures 18. The forming of the opening $O_{22}$ in the first dielectric layer 22 may be performed, for example, by using a photolithographic process. The photolithographic process may include forming a patterned photoresist mask (not shown) on the first dielectric layer 22, and etching (e.g., wet etching, dry etching, etc.) the exposed upper surface of the first dielectric layer 22 through openings in the photoresist mask. The photoresist mask may be subsequently removed by ashing, dissolving the photoresist mask or by consuming the photoresist mask during the etch process.

Figure 11B:
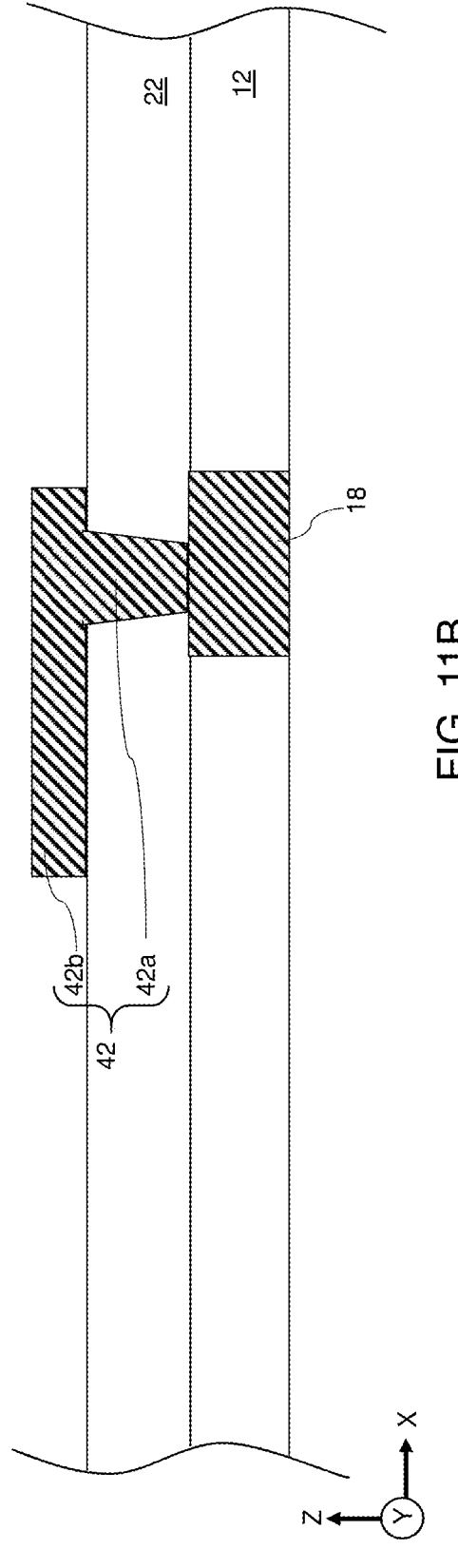
FIG. 11B is a vertical cross-sectional view of the exemplary intermediate structure after forming the first redistribution metal interconnect structure according to an embodiment of the present disclosure.

FIG. 11B is a vertical cross-sectional view of the exemplary structure after forming the first redistribution metal interconnect structure 42 according to an embodiment of the present disclosure. The first redistribution metal interconnect structure 42 may be formed by depositing a metallic material on the first dielectric layer 22. The metallic material may include, for example, Cu, Al, Mo, Co, Ru, W, TiN, TaN, WN, or a combination or a stack thereof. The metallic material may be deposited in the opening $O_{22}$ in the first dielectric layer 22 to form the via 42a in the opening $O_{22}$. The metallic material may also be formed on the surface of the first dielectric layer 22.

The metallic material on the surface of the first dielectric layer 22 may then be patterned by a photolithographic process so as to form the first metal trace 42b. The photolithographic process may include forming a patterned photoresist mask (not shown) on the metallic material, and etching (e.g., wet etching, dry etching, etc.) the exposed upper surface of the metallic material through openings in the photoresist mask. The photoresist mask may be subsequently removed by ashing, dissolving the photoresist mask or by consuming the photoresist mask during the etch process.

Figure 11C:
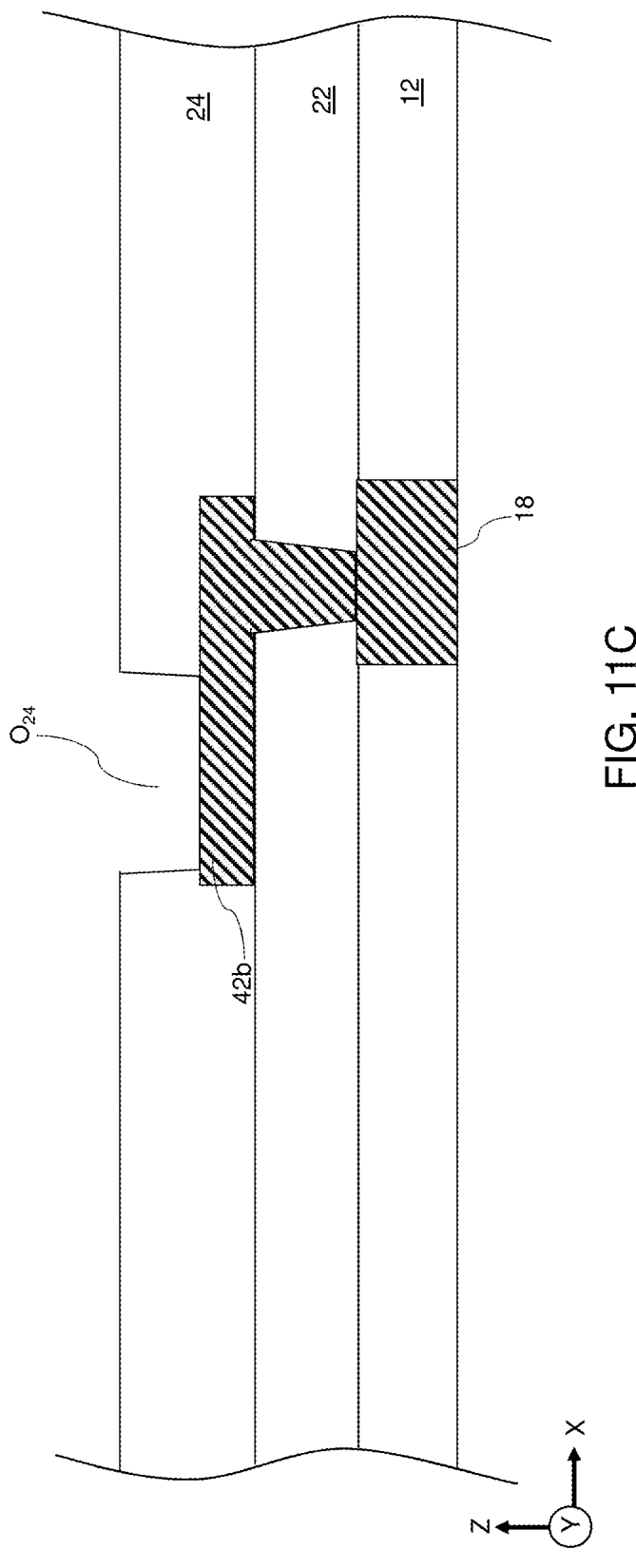
FIG. 11C is a vertical cross-sectional view of the exemplary intermediate structure after forming the second dielectric layer and the forming of an opening in the second dielectric layer according to an embodiment of the present disclosure.

FIG. 11C is a vertical cross-sectional view of the exemplary structure after forming the second dielectric layer 24 and the forming of an opening $O_{24}$ in the second dielectric layer 24 according to an embodiment of the present disclosure. The dielectric layer 24 may be formed, for example, of a dielectric polymer such as polybenzoxazole (PBO), polyimide, benzocyclobutene (BCB), or the like, that may be easily patterned using a photolithography process. Other suitable materials are within the contemplated scope of disclosure. The second dielectric layer 24 may be formed, for example, by spin coating, lamination or other suitable deposition technique. The thickness of the second dielectric layer 24 may be in a range from 2 microns to 20 microns, although lesser and greater thicknesses may also be used.

The opening $O_{24}$ may be formed in the second dielectric layer 24 so as to expose an upper surface of the first metal trace 42b. The forming of the opening $O_{24}$ in the second dielectric layer 24 may be performed, for example, by using a photolithographic process. The photolithographic process may include forming a patterned photoresist mask (not shown) on the second dielectric layer 24, and etching (e.g., wet etching, dry etching, etc.) the exposed upper surface of the second dielectric layer 24 through openings in the photoresist mask. The photoresist mask may be subsequently removed by ashing, dissolving the photoresist mask or by consuming the photoresist mask during the etch process.

The opening $O_{24}$ may be referred to as a line-shaped opening $O_{24}$ (e.g., an enhanced shape opening) and may be suitable for forming the line-shaped via 44a described above. The line-shaped opening $O_{24}$ may include one or more lines and may have a line shape such as a strip shape, an L-shape, a U-shape, an H-shape, a circular ring shape, and a rectangular ring shape. Other suitable line-shapes are within the contemplated scope of disclosure.

Figure 11D:
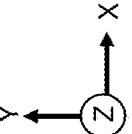
FIG. 11D is a plan view of the second dielectric layer including the line-shaped opening according to an embodiment of the present disclosure.

FIG. 11D is a plan view of the second dielectric layer 24 including the line-shaped opening $O_{24}$ according to an embodiment of the present disclosure. The first metal trace 42b is shown with dashed lines to indicate that the first metal trace 42b is under the second dielectric layer 24. The exposed upper surface of the first metal trace 42b may be visible through the line-shaped opening $O_{24}$ in the second dielectric layer 24, as illustrated in FIG. 11D. The line-shaped opening $O_{24}$ in FIG. 11D is illustrated as having an H-shape, but the line-shaped opening line $O_{24}$ may have another line shape such as a strip shape, an L-shape, a U-shape, an H-shape, a circular ring shape or a rectangular ring shape. Other suitable line shapes are within the contemplated scope of disclosure.

The line-shaped opening $O_{24}$ may include an overall width $OW_{Opening}$ (e.g., in the y-direction) in a range of 10 μm to 1000 μm, an overall length $OL_{opening}$ (in the x-direction) in a range of 10 μm to 1000 μm, and an opening height (e.g., a depth in the z-direction) in a range of 1 μm to 20 μm. The line-shaped opening $O_{24}$ may also include one line or a plurality of lines that may be connected. The one or more lines may have a line length $LL_{Opening}$ in the first direction (the x-direction) of at least 10 μm and a line width $LW_{Opening}$ in a second direction (the y-direction) of not greater than 20 μm. The line length $LL_{Opening}$ may be greater than or equal to 3 times the line width $LW_{Opening}$.

Figure 11E:
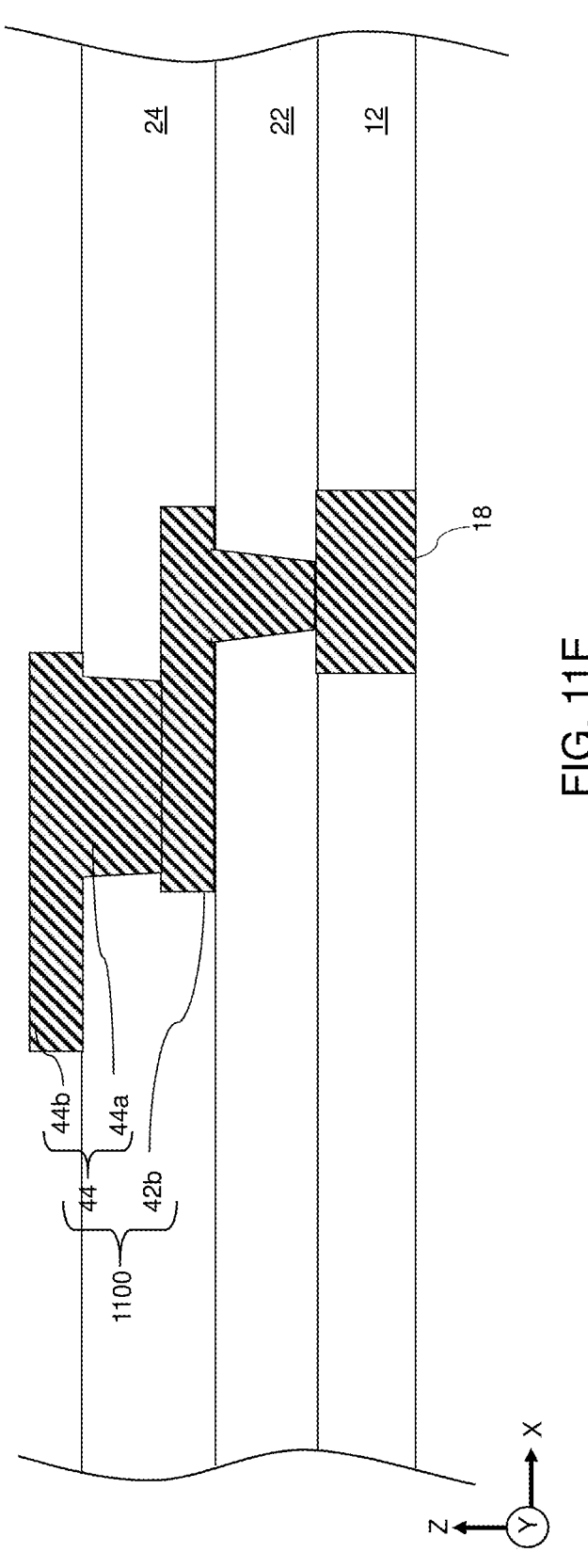
FIG. 11E is a vertical cross-sectional view of the exemplary intermediate structure after forming the second redistribution metal interconnect structure according to an embodiment of the present disclosure.

FIG. 11E is a vertical cross-sectional view of the exemplary structure after forming the second redistribution metal interconnect structure 44 of the redistribution layer structure 1100 according to an embodiment of the present disclosure. The second redistribution metal interconnect structure 44 may be formed by depositing a metallic material on the second dielectric layer 24. The metallic material may include, for example, Cu, Al, Mo, Co, Ru, W, TiN, TaN, WN, or a combination or a stack thereof. The metallic material may be deposited in the line-shaped opening $O_{24}$ in the second dielectric layer 24 to form the line-shaped via 44a in the line-shaped opening $O_{24}$. The metallic material may also be formed on the surface of the second dielectric layer 24.

The metallic material on the surface of the second dielectric layer 24 may then be patterned by a photolithographic process so as to form the second metal trace 44b. The photolithographic process may include forming a patterned photoresist mask (not shown) on the metallic material, and etching (e.g., wet etching, dry etching, etc.) the exposed upper surface of the metallic material through openings in the photoresist mask. The photoresist mask may be subsequently removed by ashing, dissolving the photoresist mask or by consuming the photoresist mask during the etch process.

It should be noted that the redistribution layer structure 1100 may be formed by other suitable processes. In particular, the redistribution layer structure 1100 may be formed by a single damascene process or by a dual damascene process.

FIG. 12 is a flowchart illustrating a method of forming a semiconductor device (e.g., interposer, RDL structure, InFO structure) according to an embodiment of the present disclosure. The method of forming a semiconductor device includes a Step 1210 of forming a first dielectric layer, a Step 1220 of forming a first metal trace on the first dielectric layer, a Step 1230 of forming a second dielectric layer on the first dielectric layer, a Step 1240 of forming a line-shaped via in the second dielectric layer, the line-shaped via being connected to the first metal trace, and a Step 1250 of forming a second metal trace on the second dielectric layer, the second metal trace being connected to the line-shaped via.

Figure 13:
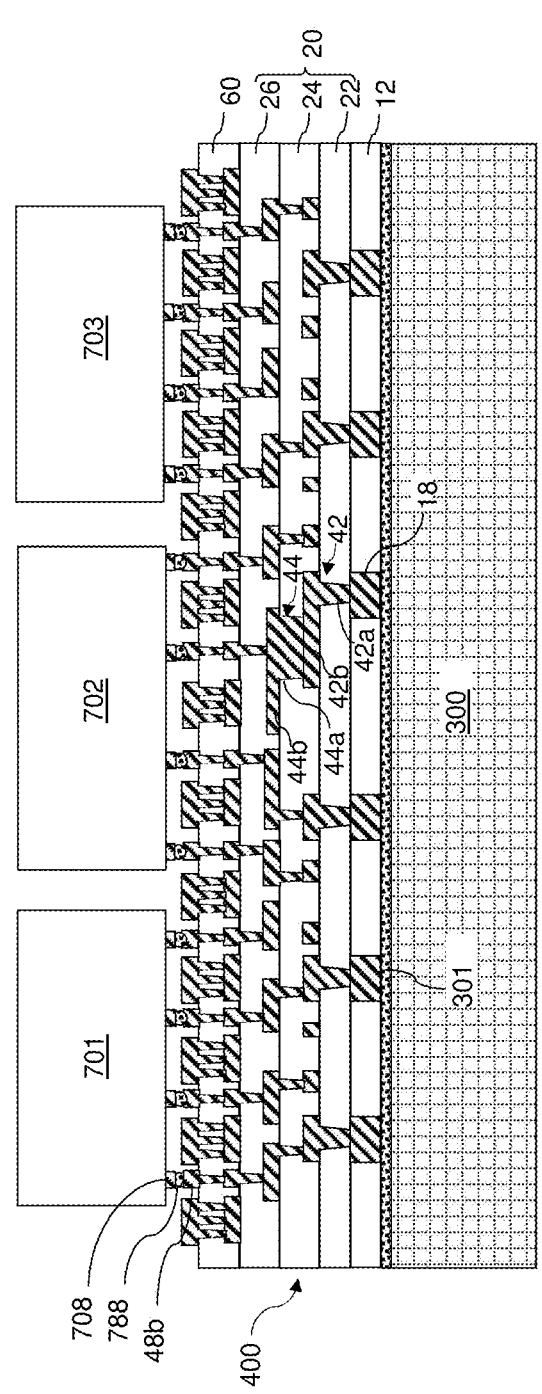
FIG. 13 is a vertical cross-sectional view of the exemplary structure after attaching one or more semiconductor dies to the interposer according to one or more embodiments.

FIG. 13 is a vertical cross-sectional view of an exemplary structure after attaching one or more semiconductor dies to the interposer 400 according to one or more embodiments. As illustrated in FIG. 13, a semiconductor die (701, 702, 703) may be bonded to a respective subset of the die-side metallic bonding structures 48b through one or more solder material portion 788. The semiconductor dies (701, 702, 703) may be electrically coupled to each other by one or more redistribution layer structures 1100 (e.g., first metal trace 42b, line-shaped via 44a and second metal trace 44b) in the interposer 400.

Each semiconductor die (701, 702, 703) may include one or more die bump structures 708. In one embodiment, the die bump structures 708 may include a two-dimensional array of microbump structures, and each semiconductor die (701, 702, 703) may be attached to the die-side metallic bump structure 48 by C2 bonding, (e.g., solder bonding between a pair of microbumps). A C2 bonding process that reflows the solder material portions 788 may be performed after the die bump structures 708 of the semiconductor dies (701, 702, 703) are disposed over the array of solder material portions 788.

The semiconductor dies (701, 702, 703) may include any type of semiconductor die. In particular, the semiconductor dies (701, 702, 703) may include a system-on-chip (SoC) die such as an application processor die, a high bandwidth memory (HDM) die or a system on integrated chips (SOIC) die. The semiconductor dies (701, 702, 703) may include a first semiconductor die 701, a second semiconductor die 702, and a third semiconductor die that may be different from each other. In one embodiment, one or more of the first semiconductor die 701, second semiconductor die 702 and third semiconductor die 703 may include a central processing unit die, a graphic processing unit die, a system-on-chip (SoC) die, and high bandwidth memory (HBM) die, each of which includes a vertical stack of static random access memory dies and provides high bandwidth as defined under JEDEC standards, i.e., standards defined by The JEDEC Solid State Technology Association. An upper surface of the semiconductor dies (701, 702, 703) may be attached to a same interposer 400 may be positioned within a same horizontal plane.

Figure 14:
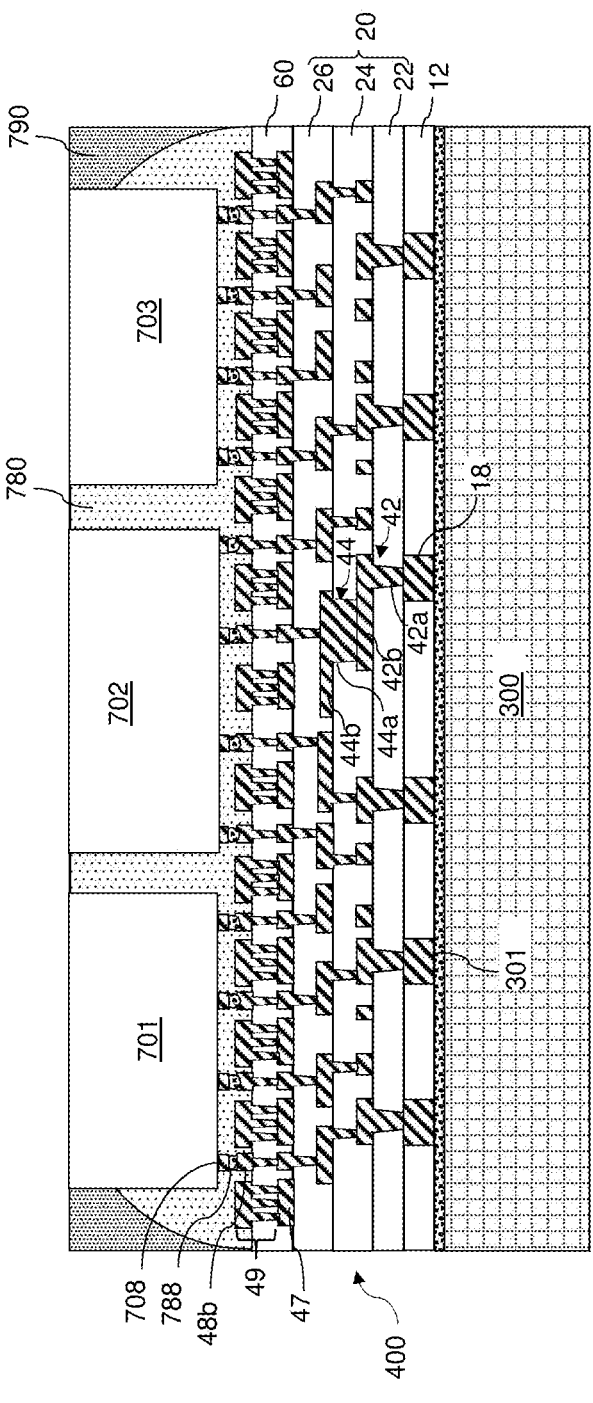
FIG. 14 is a vertical cross-sectional view of the exemplary structure after formation of a fan-out wafer-level package according to an embodiment of the present disclosure.

FIG. 14 is a vertical cross-sectional view of the exemplary structure after formation of a fan-out wafer-level package according to an embodiment of the present disclosure. As illustrated in FIG. 14, an underfill material portion 780 may be formed around each bonded array of solder material portions 788. The underfill material portion 780 may be formed by injecting an underfill material around the array of solder material portions 788 after the solder material portions 788 are reflowed. Any known underfill material application method may be used, which may be, for example, the capillary underfill method, the molded underfill method, or the printed underfill method. In one embodiment, the one or more semiconductor dies (701, 702, 703) may be attached to an interposer 400 and an underfill material portion 780 may continuously extend underneath the one or more semiconductor dies (701, 702, 703).

According to an aspect of the present disclosure, the metallic support structures 49 and the metallic base plates 47 may provide mechanical support to underlying structures within the interposer 400 during application and curing of the underfill material portion 780. Specifically, the underfill application process may apply pressure to the distal dielectric layer 60. The combination of the metallic support structures 49 and the metallic base plates 47 may provide mechanical support to prevent, or reduce, distortion of the distal dielectric layer 60 during the underfill application process, and may maintain the structural integrity of the interposer 400.

An epoxy molding compound (EMC) may be formed on the interposer 400 and the semiconductor dies (701, 702, 703) so as to form an EMC die frame 790. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the adhesive layer 301. For example, the curing temperature of the EMC may be in a range from 125° C. to 150° C.

The EMC may be cured at a curing temperature to form the EMC die frame 790 that may laterally encloses the semiconductor dies (701, 702, 703). Excess portions of the EMC may be removed from above the horizontal plane including the top surfaces of the semiconductor dies (701, 702, 703) by a planarization process, which may use chemical mechanical planarization.

Figure 15:
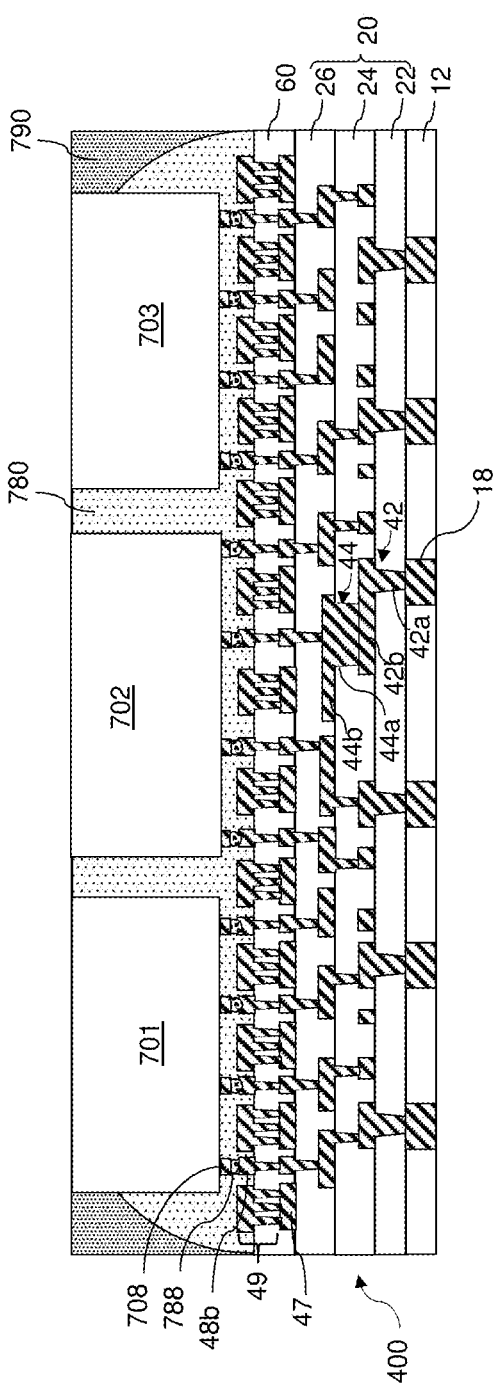
FIG. 15 is a vertical cross-sectional view of the exemplary structure after removal of the carrier substrate according to an embodiment of the present disclosure.

FIG. 15 is a vertical cross-sectional view of the exemplary structure after removal of the carrier substrate 300 according to an embodiment of the present disclosure. As illustrated in FIG. 15, the carrier substrate 300 may be detached from the assembly of the interposer 400, the semiconductor dies (701, 702, 703), and the EMC die frame 790. The assembly may be referred to as an interposer module. The adhesive layer 301 may be deactivated, for example, by a thermal anneal at an elevated temperature. Embodiments may include an adhesive layer 301 that includes a thermally-deactivated adhesive material. In other embodiments in which the carrier substrate 300 may be transparent, an adhesive layer 301 may include an ultraviolet-deactivated adhesive material.

The interposer 400, the semiconductor dies (701, 702, 703), and the EMC die frame 790 together may constitute an interposer module or fan-out wafer-level package (FOWLP). The EMC die frame 790 and the interposer 400 may have vertically coincident sidewalls (e.g., sidewalls located within a same vertical plane). In embodiments in which the FOWLP includes a plurality of semiconductor dies (701, 702, 703), the underfill material portion 780 may contact sidewalls of the plurality of semiconductor dies (701, 702). The EMC die frame 790 may continuously extend around, and laterally encircle, the one or more semiconductor dies (701, 702, 703) within the FOWLP.

Figure 16:
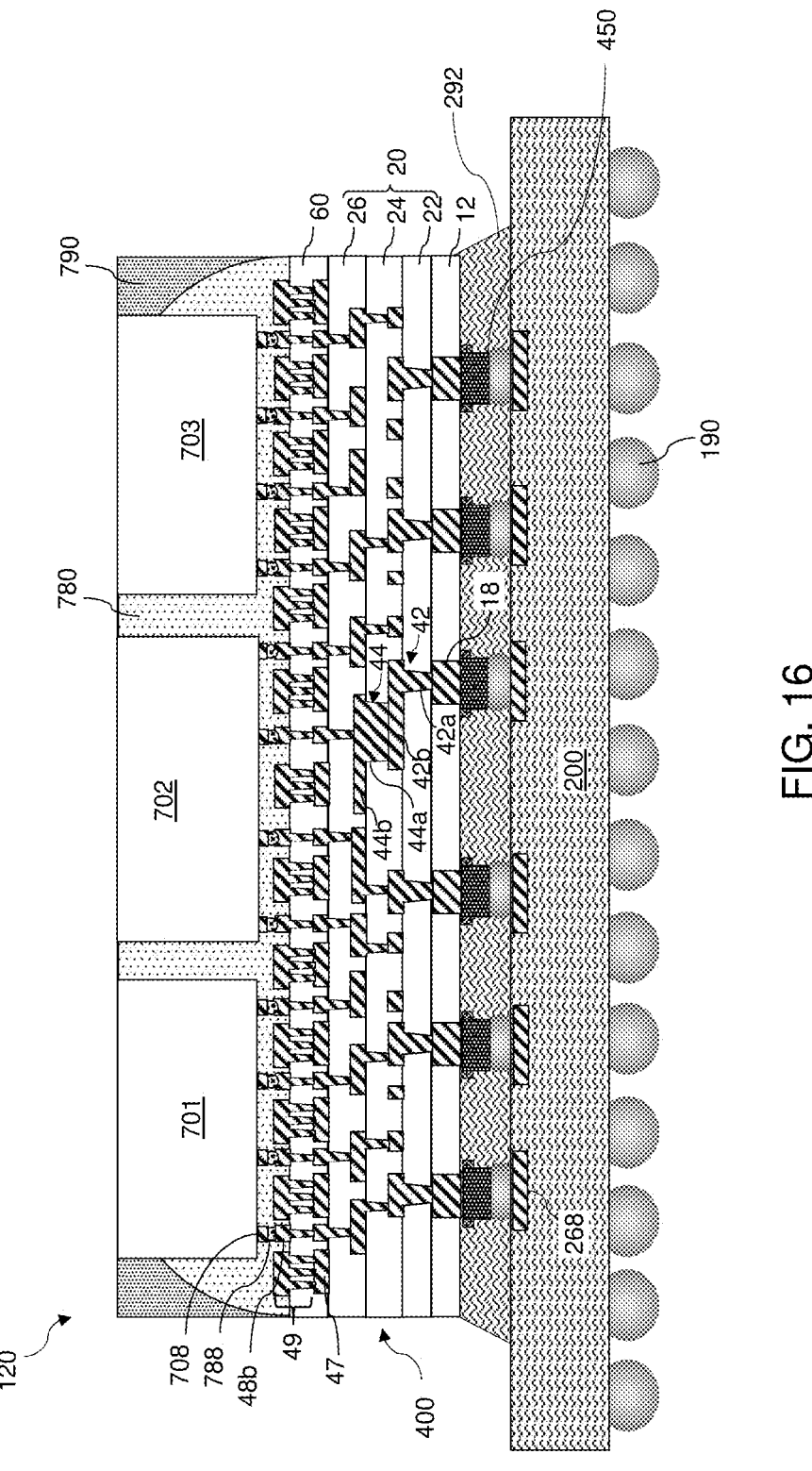
FIG. 16 is a vertical cross-sectional view of the exemplary structure after attaching a package substrate to the fan-out wafer-level package according to an embodiment of the present disclosure.

FIG. 16 is a vertical cross-sectional view of the exemplary structure after attaching a package substrate 200 to the interposer module or fan-out wafer-level package according to an embodiment of the present disclosure. As illustrated in FIG. 16, the interposer 400 may be mounted on a package substrate 200. The package substrate 200 may include a cored package substrate including a package core, or a coreless package substrate that does not include a package core. Alternatively, the package substrate 200 may include a system-on-integrated substrate (SoIS) including redistribution layers and/or dielectric interlayers, at least one embedded interposer (such as a silicon interposer). Such a system-on-integrated substrate may include layer-to-layer interconnections using copper or solder material portions, microbumps, package underfill material (such as molded underfill material portions), and/or an adhesion film. It should be understood that the scope of the present disclosure is not limited by any particular type of substrate package and may include an SoIS.

One or more solder material portions 450 may be attached to the package-side metallic bonding structures 18 of the interposer 400. The solder material portions 450 may be bonded to chip-side bonding pads 268 in the package substrate 200. A reflow process may be performed to reflow the solder material portions 450, thereby inducing bonding between the interposer 400 and the package substrate 200. In one embodiment, the solder material portions 450 may include C4 solder balls, and the assembly of the interposer 400, the at least one semiconductor die (701, 702, 703), and the EMC die frame 790 may be attached to the package substrate 200 using an array of C4 solder balls. A package underfill material 292 may be formed around the solder material portions 450 by applying and shaping an underfill material. Optionally, a stabilization structure such as a cap structure or a ring structure, may be attached to the assembly of the interposer 400, the at least one semiconductor die (701, 702, 703), the EMC die frame 790, and the package substrate 200 to reduce deformation of the assembly during subsequent processing steps and/or during usage of the assembly.

An array of solder joints 190 may be formed on the package substrate for allowing the package substrate to be mounted to a printed circuit board (PCB) substrate. The solder joints 190 may be formed by disposing an array of solder balls between the package substrate 200 and an array of bonding pads of the PCB substrate, and then reflowing the array of solder balls. The package substrate 200 may be electrically coupled to the PCB substrate through the array of solder joints 190.

Referring to FIGS. 1-16, an interposer 400 may include a first metal trace 42b located on a first dielectric layer 22, a second dielectric layer 24 located on the first dielectric layer 22, a line-shaped via 44a located in the second dielectric layer 24 and connected to the first metal trace 42b, and a second metal trace 44b located on the second dielectric layer 24 and connected to the line-shaped via 44a. In an embodiment, the line-shaped via 44a may include a via width in a range of 10 μm to 1000 μm and a via length in a range of 10 μm to 1000 μm. In one embodiment, the first metal trace 42b and the second metal trace 44b may extend longitudinally in a first direction, and the line-shaped via 44a may contact the first metal trace 42b and the second metal trace 44b over an entirety of the via length of the line-shaped via 44a and over an entirety of the via width of the line-shaped via 44a. In one embodiment, the line-shaped via 44a may include a line having a line length in the first direction of at least 10 μm and a line width in a second direction perpendicular to the first direction of not greater than 20 μm. In one embodiment, the line length may be greater than or equal to 3 times the line width. In one embodiment, the line-shaped via 44a may include one of a strip shape, an L-shape, a U-shape, an H-shape, a circular ring shape and a rectangular ring shape (e.g., a hollow rectangular shape). The line-shaped via 44a may include one of a straight metal bar having a strip shape, a ratio of length to width of the straight metal bar being in a range from 3:1 to 20:1, a curved metal bar having a circular ring shape, a ratio of length to width of the metal bar being in a range from 3:1 to 20:1, and a plurality of metal bars that are perpendicularly arranged to have one of an L-shape, a U-shape, an H-shape and a rectangular ring shape, a ratio of length to width of at least one metal bar of the plurality of metal bars being in a range from 3:1 to 20:1. In one embodiment, each of the first dielectric layer 22 and the second dielectric layer 24 may include a polymer layer that may include one of polyimide (PI), benzocyclobutene (BCB), and polybenzobisoxazole (PBO). In one embodiment, the first metal trace 42b, the second metal trace 44b and the line-shaped via 44a may constitute a redistribution layer (RDL) structure. In one embodiment, the line-shaped via 44a may include at least one of Cu, Al, Mo, Co, Ru, W, TiN, TaN and WN.

Referring to FIGS. 1-16, a method of forming an interposer 400 may include forming a first dielectric layer 22, forming a first metal trace 42b on the first dielectric layer 22, forming a second dielectric layer on 24 the first dielectric layer 22, forming a line-shaped via 44a in the second dielectric layer 24, the line-shaped via 44a being connected to the first metal trace 42b, and forming a second metal trace 44b on the second dielectric layer 24, the second metal trace 44b being connected to the line-shaped via 44a. In one embodiment, the forming of the line-shaped via 44a may include forming a line-shaped opening $O_{24}$ in the second dielectric layer 24, and depositing a metal material in the line-shaped opening $O_{24}$. In one embodiment, the forming of the line-shaped via 44a may include forming the line-shaped via 44a to have a via width in a range of 10 μm to 1000 μm and a via length in a range of 10 μm to 1000 μm. In one embodiment, the forming of the line-shaped via 44a may include forming the line-shaped via 44a so as to contact the first metal trace 42b over an entirety of the via length of the line-shaped via 44a and over an entirety of the via width of the line-shaped via 44a. In one embodiment, the forming of the line-shaped via 44a may include forming the line-shaped via 44a to include a line having a line length in the first direction of at least 10 μm and a line width in a second direction perpendicular to the first direction in a range of not greater than 20 μm. In one embodiment, the forming of the line-shaped via 44a may include forming the line-shaped via 44a to include a line having the line length that may be greater than or equal to 3 times the line width. In one embodiment, the forming of the line-shaped via 44a may include forming the line-shaped via 44a to have one of a strip shape, an L-shape, a U-shape, an H-shape, a circular ring shape and a rectangular ring shape (e.g., a hollow rectangular shape). The forming of the line-shaped via 44a in the second dielectric layer may include forming a straight metal bar having a strip shape in the second dielectric layer, wherein a ratio of a length to a width of the straight metal bar is in a range from 3:1 to 20:1, forming a curved metal bar having a circular ring shape in the second dielectric layer, wherein a ratio of a length to a width of the curved metal bar being in a range from 3:1 to 20:1; or forming a plurality of metal bars in the second dielectric layer, wherein the plurality of metal bars are perpendicularly arranged to have one of an L-shape, a U-shape, an H-shape and a rectangular ring shape, and a ratio of a length to a width of at least one metal bar of the plurality of metal bars is in a range from 3:1 to 20:1. In one embodiment, each of the forming of the first dielectric layer and the forming of the second dielectric layer may include depositing a polymer layer including one of polyimide (PI), benzocyclobutene (BCB), and polybenzobisoxazole (PBO). In one embodiment, the forming of the line-shaped via 44a may include depositing a metal material that may include at least one of Cu, Al, Mo, Co, Ru, W, TiN, TaN and WN.

Referring to FIGS. 1-16, an interposer module 120 may include an interposer 400 that may include a first metal trace 42*b* located on a first dielectric layer 22, a second dielectric layer 24 located on the first dielectric layer 22, a line-shaped via 44*a* including a metal bar located in the second dielectric layer 24 and connected to the first metal trace 42*b*, wherein a length of the metal bar and a depth of the metal bar are greater than a width of the metal bar, and a second metal trace 44*b* located on the second dielectric layer 24 and connected to the line-shaped via 44*a*, and a plurality of semiconductor dies (701, 702, 703) mounted on the interposer 120 and electrically coupled by the interposer 120. In one embodiment the metal bar may include a straight metal bar, wherein a ratio of a length to a width of the straight metal bar is in a range from 3:1 to 20:1. In one embodiment, the metal bar may include a curved metal bar that is curved into a loop, wherein a ratio of a length to a width of the curved metal bar is in a range from 3:1 to 20:1. In one embodiment, the metal bar may include a plurality of metal bars including a first metal bar and a second metal bar, wherein the second bar is perpendicularly connected to an end of the first metal bar, and wherein a ratio of a length to a width of at least one metal bar of the plurality of metal bars is in a range from 3:1 to 20:1. In one embodiment, the metal bar may include a plurality of metal bars including a first metal bar, a second metal bar and a third metal bar, wherein the third metal bar is parallel to the first metal bar, and the second metal bar is perpendicularly connected to at least one of: an end of the first metal bar and to a corresponding end of the third metal bar; or a center of the first metal bar and to a center of the third metal bar; and wherein a ratio of a length to a width of at least one metal bar of the plurality of metal bars is in a range from 3:1 to 20:1. In one embodiment, the metal bar may include a plurality of metal bars including a first metal bar, a second metal bar, a third metal bar and a fourth metal bar, wherein: the third metal bar is parallel to the first metal bar, the second metal bar is perpendicularly connected to a first end of the first metal bar and to a corresponding first end of the third metal bar, the fourth metal bar is perpendicularly connected to a second end of the first metal bar and to a corresponding second end of the third metal bar, and a ratio of a length to a width of at least one metal bar of the plurality of metal bars is in a range from 3:1 to 20:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interposer, comprising:

a plurality of dielectric layers including a first dielectric layer and a second dielectric layer stacked on the first dielectric layer;

a first redistribution interconnect structure comprising a first metal trace located on the first dielectric layer;

a second redistribution interconnect structure comprising a metal layer comprising:

a lower metal layer portion comprising a line-shaped via located in the second dielectric layer and connected to the first metal trace, wherein the line-shaped via has a horizontal cross-sectional shape that is one of an L-shape, a U-shape, or an H-shape; and an upper metal layer portion comprising a second metal trace located on the second dielectric layer and connected to the line-shaped via, wherein a bottommost surface of the second metal trace directly contacts an uppermost surface of the second dielectric layer.

2. The interposer of claim 1, wherein a width of the line-shaped via is less than a width of the first metal trace and comprises a via width in a range of 10 μm to 1000 μm, and a length of the line-shaped via comprises a via length in a range of 10 μm to 1000 μm.

3. The interposer of claim 2, wherein the second dielectric layer is stacked on the first dielectric layer in a third direction, the first metal trace and the second metal trace extend longitudinally in a first direction perpendicular to the third direction, and the line-shaped via contacts the first metal trace and the second metal trace over an entirety of the via length of the line-shaped via and over an entirety of the via width of the line-shaped via.

4. The interposer of claim 3, wherein the length comprises a line length in the first direction of at least 10 μm and the width comprises a line width in a second direction perpendicular to the first direction and the third direction of not greater than 20 μm.

5. The interposer of claim 4, wherein the line length is greater than or equal to 3 times the line width.

6. The interposer of claim 1, wherein the line-shaped via has a horizontal cross-sectional shape that comprises an L-shape.

7. The interposer of claim 1, wherein the line-shaped via comprises:

a plurality of metal bars that are perpendicularly arranged in the same plane to have one of an L-shape, a U-shape, or an H-shape, wherein a ratio of a length to a width of at least one metal bar of the plurality of metal bars is in a range from 3:1 to 20:1.

8. The interposer of claim 1, wherein the first metal trace, the second metal trace and the line-shaped via constitute a redistribution layer (RDL) structure.

9. An interposer module, comprising:

an interposer comprising:

a first redistribution interconnect structure comprising a first metal trace located on a first dielectric layer;

a second dielectric layer located on the first dielectric layer;

a second redistribution interconnect structure comprising a metal layer comprising:

a lower metal layer portion comprising a line-shaped via comprising a metal bar located in the second dielectric layer and connected to the first metal trace, wherein the line-shaped via has a horizontal cross-sectional shape that is one of an L-shape, a U-shape, or an H-shape; and an upper metal layer portion comprising a second metal trace located on the second dielectric layer and connected to the metal bar of the line-shaped via wherein a bottommost surface of the second metal trace directly contacts an uppermost surface of the second dielectric layer; and a plurality of semiconductor dies mounted on the interposer and electrically coupled by the interposer.

10. The interposer module of claim 9, wherein the metal bar comprises:

a straight metal bar, wherein a ratio of a length to a width of the straight metal bar is in a range from 3:1 to 20:1.

11. The interposer module of claim 9, wherein the metal bar comprises a plurality of metal bars including a first metal bar and a second metal bar, wherein the second bar is perpendicularly connected to an end of the first metal bar, and wherein a ratio of a length to a width of at least one metal bar of the plurality of metal bars is in a range from 3:1 to 20:1.

12. The interposer module of claim 9, wherein the metal bar comprises a plurality of metal bars including a first metal bar, a second metal bar and a third metal bar, wherein the third metal bar is parallel to the first metal bar, and the second metal bar is perpendicularly connected to at least one of:

an end of the first metal bar and to a corresponding end of the third metal bar; or a center of the first metal bar and to a center of the third metal bar; and wherein a ratio of a length to a width of at least one metal bar of the plurality of metal bars is in a range from 3:1 to 20:1.

13. The interposer module of claim 9, wherein the metal bar comprises a plurality of metal bars including a first metal bar, a second metal bar, a third metal bar and a fourth metal bar, wherein:

the third metal bar is parallel to the first metal bar, the second metal bar is perpendicularly connected to a first end of the first metal bar and to a corresponding first end of the third metal bar, the fourth metal bar is perpendicularly connected to a second end of the first metal bar and to a corresponding second end of the third metal bar, and a ratio of a length to a width of at least one metal bar of the plurality of metal bars is in a range from 3:1 to 20:1.

14. An interposer, comprising:

a polymer layer;

a first redistribution interconnect structure comprising a first metal trace in the polymer layer;

a second redistribution interconnect structure comprising a metal layer comprising:

an upper metal layer portion comprising a second metal trace on the polymer layer over the first metal trace, wherein a bottommost surface of the second metal trace directly contacts an uppermost surface of the polymer layer; and a lower metal layer portion comprising a metal via in the polymer layer, wherein the metal via connects the first metal trace to the second metal trace, and the metal via has a horizontal cross-sectional shape that is one of an L-shape, a U-shape, or an H-shape.

15. The interposer of claim 14, wherein a combined thickness of the first metal trace and the metal via is substantially equal to a thickness of the polymer layer.

16. The interposer of claim 14, wherein the metal via has a width less than a width of the first metal trace and is in a range of 10 μm to 1000 μm and a length in a range of 10 μm to 1000 μm.

17. The interposer of claim 14, wherein an entirety of a bottom surface of the metal via contacts an upper surface of the first metal trace and an entirety of an upper surface of the metal via contacts the bottom surface of the second metal trace.

18. The interposer of claim 14, wherein the metal via comprises a line-shaped portion, and a length of the line-shaped portion is greater than or equal to 3 times a width of the line-shaped portion.

19. The interposer of claim 14, wherein the metal via comprises a plurality of straight metal bars.

20. The interposer of claim 14, further comprising:

a lower polymer layer having an uppermost surface in contact with a bottom surface of the first metal trace, wherein the first redistribution interconnect structure further comprises a lower metal via in the lower polymer layer and a width of the lower metal via is less than the width of the metal via.

* * * * *